United States Patent
Tojo et al.

(10) Patent No.: US 10,510,726 B2
(45) Date of Patent: Dec. 17, 2019

(54) SEMICONDUCTOR DEVICE, METHOD FOR MANUFACTURING SEMICONDUCTOR DEVICE, AND METHOD FOR MANUFACTURING SEMICONDUCTOR PACKAGE

(71) Applicant: Kabushiki Kaisha Toshiba, Minato-ku (JP)

(72) Inventors: Akira Tojo, Naka (JP); Tatsuya Kobayashi, Yokohama (JP); Masayuki Uchida, Yokohama (JP); Takashi Ito, Yokohama (JP); Kazuo Shimokawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/996,895

(22) Filed: Jun. 4, 2018

(65) Prior Publication Data

US 2019/0067250 A1  Feb. 28, 2019

(30) Foreign Application Priority Data

Aug. 28, 2017  (JP) ................. 2017-163602

(51) Int. Cl.
*H01L 25/065* (2006.01)
*H01L 25/18* (2006.01)
*H01L 21/78* (2006.01)
*H01L 25/00* (2006.01)

(52) U.S. Cl.
CPC .......... *H01L 25/0657* (2013.01); *H01L 21/78* (2013.01); *H01L 25/18* (2013.01);
(Continued)

(58) Field of Classification Search
CPC ..... H01L 25/0657; H01L 25/50; H01L 21/78; H01L 25/18; H01L 2225/06562;
(Continued)

(56) References Cited

U.S. PATENT DOCUMENTS

| 8,742,872 B2 | 6/2014 | Iwasaki et al. |
| 2004/0000723 A1 | 1/2004 | Egawa |
| 2005/0006746 A1 | 1/2005 | Egawa |

(Continued)

FOREIGN PATENT DOCUMENTS

| CN | 10-2013-0024567 A | 3/2013 |
| JP | 2003-152131 | 5/2003 |

(Continued)

*Primary Examiner* — Thanh T Nguyen
(74) *Attorney, Agent, or Firm* — Oblon, McClelland, Maier & Neustadt, L.L.P.

(57) ABSTRACT

A semiconductor device includes a base including interconnects, a first semiconductor chip including a first semiconductor element portion, and a second semiconductor chip including a second semiconductor element portion. The second semiconductor chip is electrically connected to the first semiconductor chip via at least one of the interconnects. The second semiconductor chip includes a first region, a first portion, and a second portion. The first region includes the second semiconductor element portion. The first portion is continuous with the first region. The second portion is continuous with the first region and is separated from the first portion in a second direction crossing a first direction. The first direction is from the base toward the first region. The second portion, the first portion, and at least a portion of the first semiconductor chip each is positioned between the base and the first region.

16 Claims, 21 Drawing Sheets

(52) U.S. Cl.
CPC ...... *H01L 25/50* (2013.01); *H01L 2225/0651* (2013.01); *H01L 2225/06506* (2013.01); *H01L 2225/06562* (2013.01); *H01L 2225/06582* (2013.01)

(58) Field of Classification Search
CPC ... H01L 2225/0651; H01L 2225/06582; H01L 2225/06506
See application file for complete search history.

(56) References Cited

U.S. PATENT DOCUMENTS

2008/0054451 A1\* 3/2008 Bauer ................ H01L 25/0657 257/723

2017/0033081 A1\* 2/2017 Yoo .................... H01L 25/0657

FOREIGN PATENT DOCUMENTS

| | | |
|---|---|---|
| JP | 2004-22928 | 1/2004 |
| JP | 3507059 | 3/2004 |
| JP | 2004-128356 A | 4/2004 |
| JP | 2004-296724 | 10/2004 |
| JP | 2007-103680 A | 4/2007 |
| JP | 2009-16717 | 1/2009 |
| JP | 2009-26843 | 2/2009 |
| JP | 2013-131557 | 7/2013 |
| TW | 200908275 A | 2/2009 |
| TW | M406260 U1 | 6/2011 |
| WO | WO 2011/114628 A1 | 9/2011 |

\* cited by examiner

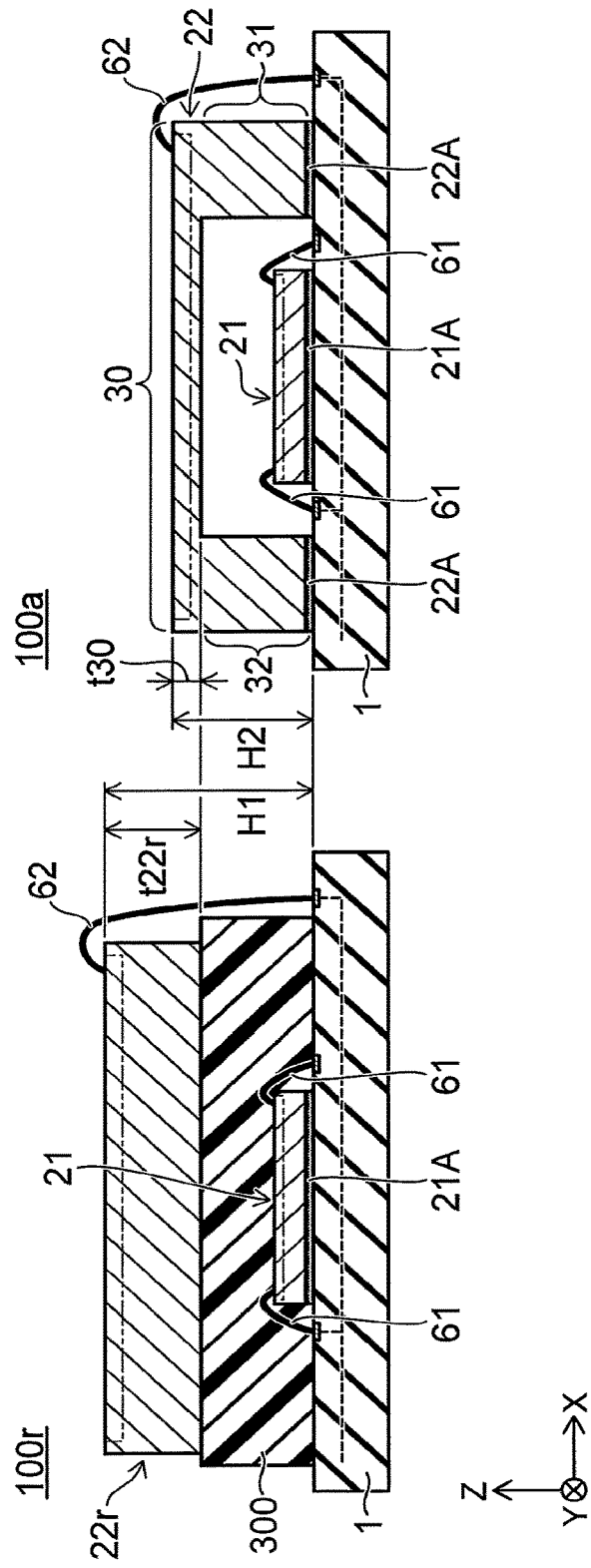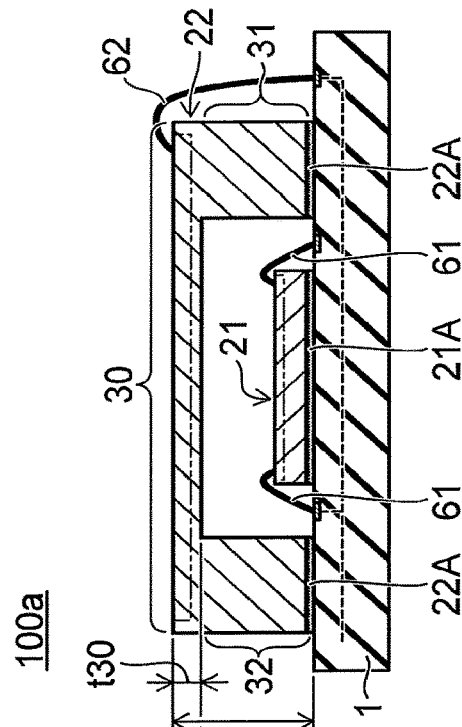

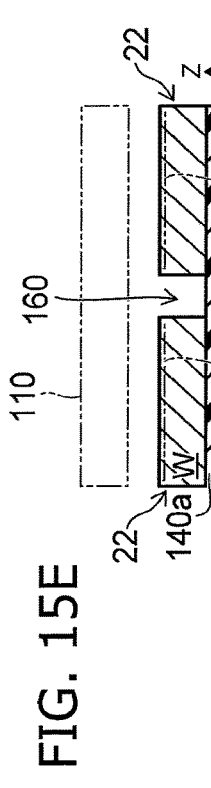
FIG. 15A
FIG. 15B
FIG. 15C
FIG. 15D
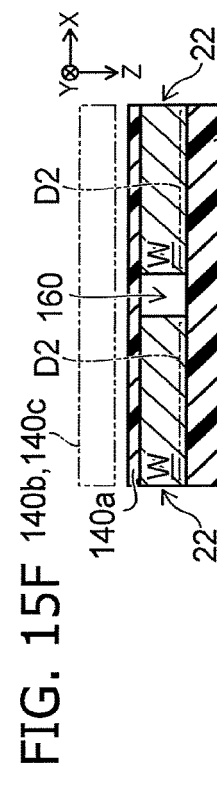
FIG. 15E
FIG. 15F
FIG. 15G
FIG. 15H

US 10,510,726 B2

SEMICONDUCTOR DEVICE, METHOD FOR MANUFACTURING SEMICONDUCTOR DEVICE, AND METHOD FOR MANUFACTURING SEMICONDUCTOR PACKAGE

CROSS-REFERENCE TO RELATED APPLICATIONS

This application is based upon and claims the benefit of priority from Japanese Patent Application No. 2017-163602, filed on Aug. 28, 2017; the entire contents of which are incorporated herein by reference.

FIELD

Embodiments relate to a semiconductor device, a method for manufacturing the semiconductor device, and a method for manufacturing a semiconductor package.

BACKGROUND

A semiconductor device is known in which, for example, multiple semiconductor chips are stacked and housed inside a package. It is desirable to reduce the thickness of the package of such a semiconductor device.

BRIEF DESCRIPTION OF THE DRAWINGS

FIG. 4A is a schematic cross-sectional view illustrating a semiconductor device according to a reference example, and FIG. 4B is a schematic cross-sectional view illustrating the semiconductor device according to the first embodiment;

FIG. 15A to FIG. 15H are schematic cross-sectional views in order of the processes, illustrating the method for manufacturing the semiconductor device according to the sixth embodiment;

DETAILED DESCRIPTION

Figure 1A:
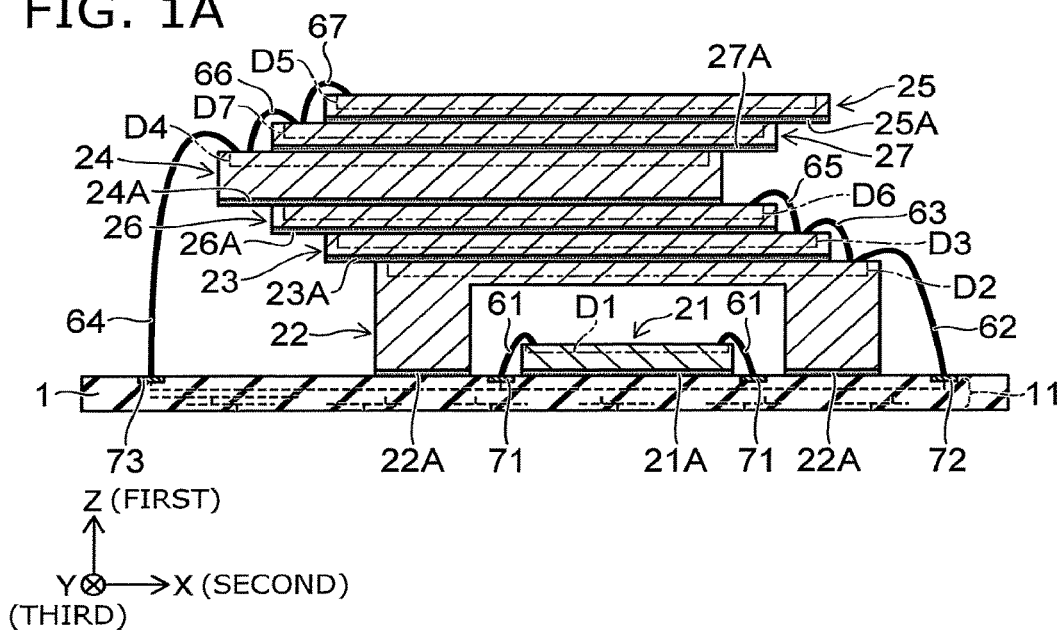
FIG. 1A and FIG. 1B are schematic cross-sectional views illustrating a semiconductor device according to a first embodiment.

According to one embodiment, a semiconductor device includes a base, a first semiconductor chip, and a second semiconductor chip. The base includes interconnects. The first semiconductor chip includes a first semiconductor element portion. The second semiconductor chip includes a second semiconductor element portion. The second semiconductor chip is electrically connected to the first semiconductor chip via at least one of the interconnects. The second semiconductor chip includes a first region, a first portion, and a second portion. The first region includes the second semiconductor element portion. The first portion is continuous with the first region. The second portion is continuous with the first region and is separated from the first portion in a second direction crossing a first direction. The first direction is from the base toward the first region. The second portion, the first portion, and at least a portion of the first semiconductor chip each is positioned between the base and the first region.

Embodiments of the present invention will be described hereinafter with reference to the accompanying drawings.

The drawings are schematic or conceptual, and the relationship between the thickness and the width of each portion, the ratio of the size between the portions, and the like are not necessarily the same as the actual ones. Even if they represent the same part, sometimes the sizes and ratios of the parts are different from each other depending on the drawing.

In the specification and each figure, the same reference numerals are given to the same elements as those described above with reference to the preceding figures, and the detailed description will be omitted as appropriate.

First Embodiment

Figure 1B:
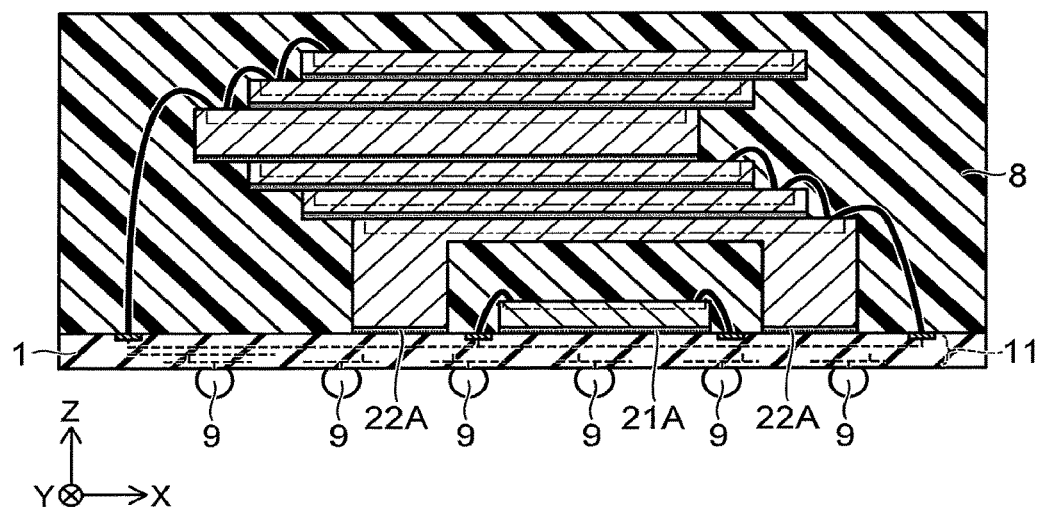

FIG. 1A and FIG. 1B are schematic cross-sectional views illustrating a semiconductor device according to a first embodiment.

A first direction, a second direction, and a third direction are shown in FIG. 1A and FIG. 1B. In the specification, the first direction is taken as a Z-axis direction. One direction that crosses, e.g., is orthogonal to, the Z-axis direction is taken as the second direction. The second direction is an X-axis direction. One direction that crosses, e.g., is orthogonal to, each of the X-axis direction and the Z-axis direction is taken as the third direction. The third direction is a Y-axis direction.

As shown in FIG. 1A, the semiconductor device 100a according to the first embodiment includes a base 1 and first to seventh semiconductor chips 21 to 27. The base 1 includes an interconnect group 11 including multiple interconnects. The base 1 includes, for example, an insulating resin; and the interconnect group 11 is provided in the interior of the insulating resin.

As shown in FIG. 1B, an insulative sealing member 8 is provided on the base 1. The insulative sealing member 8 surrounds the first to seventh semiconductor chips 21 to 27. The first to seventh semiconductor chips 21 to 27 are insulatively sealed by the insulative sealing member 8. The state shown in FIG. 1B is a semiconductor package. The first to seventh semiconductor chips 21 to 27 respectively include first to seventh semiconductor element portions D1 to D7. A not-illustrated semiconductor element is provided in each of the first to seventh semiconductor element portions D1 to D7. In the first embodiment, the first semiconductor chip 21 is, for example, a controller chip. The second to seventh semiconductor chips 22 to 27 each are, for example, semiconductor memory chips. The first semiconductor chip 21 is electrically connected to the second to seventh semiconductor chips 22 to 27 and controls the second to seventh semiconductor chips 22 to 27. Multiple external terminals 9 are provided at the base 1. The multiple external terminals 9 each are electrically connected to at least one of the interconnects included in the interconnect group 11 and are electrically connected to, for example, the first semiconductor chip 21, etc.

Figure 2A:
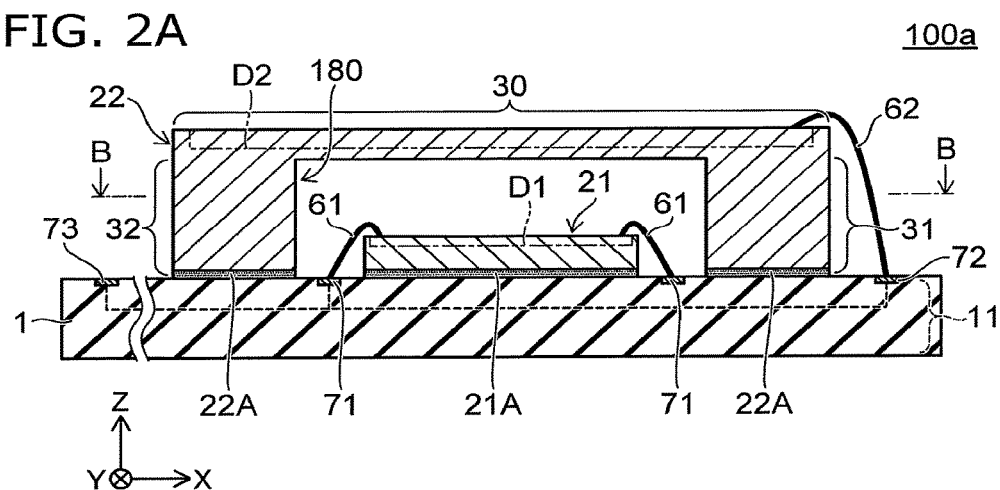
FIG. 2A is a schematic cross-sectional view illustrating the semiconductor device according to the first embodiment.
Figure 2B:
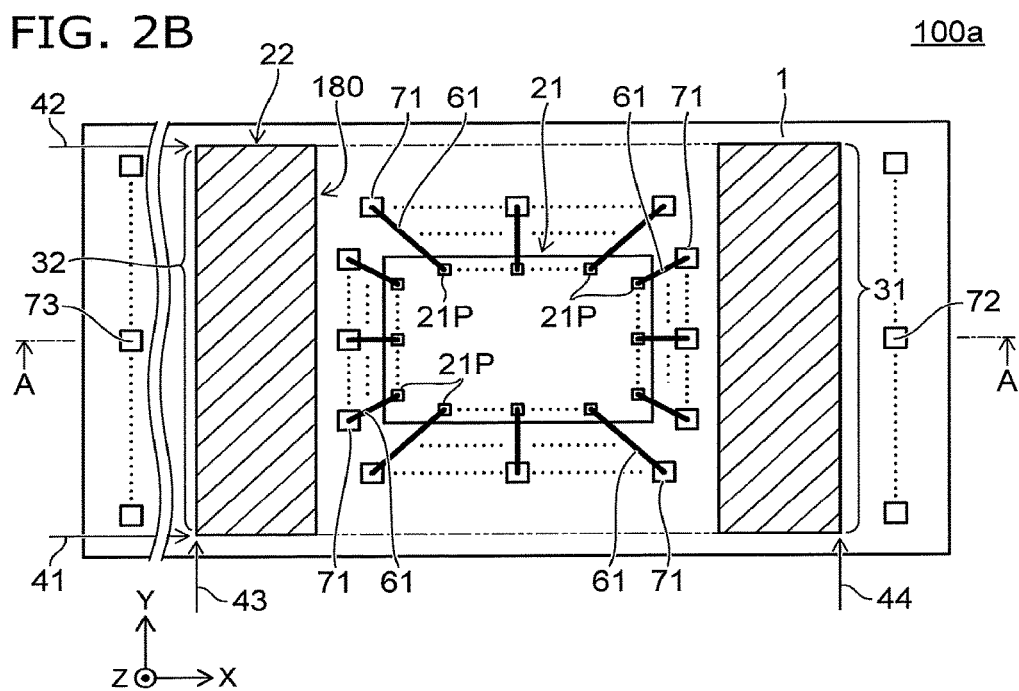
FIG. 2B is a schematic plan view illustrating the semiconductor device according to the first embodiment.

FIG. 2A is a schematic cross-sectional view illustrating the semiconductor device according to the first embodiment. FIG. 2B is a schematic plan view illustrating the semiconductor device according to the first embodiment. The base 1 and the first and second semiconductor chips 21 and 22 are shown in FIG. 2A and FIG. 2B. In FIG. 2B, a portion of the second semiconductor chip 22 is shown as a cross section. The cross section shown in FIG. 2B is along line B-B in FIG. 2A. The cross section shown in FIG. 2A is along line A-A in FIG. 2B.

As shown in FIG. 2A and FIG. 2B, the second semiconductor chip 22 includes a first region 30 that includes the second semiconductor element portion D2, a first portion 31 that is continuous with the first region 30, and a second portion that is continuous with the first region 30. In the specification, "continuous" includes, for example, the first region 30, the first portion 31, and the second portion 32 being made of, for example, one semiconductor substrate. In the first embodiment, the first and second portions 31 and 32 are not bonded to the first region 30 but have an "integral structure." The second semiconductor chip 22 includes, for example, a trench 180. The trench 180 is provided in the second semiconductor chip 22 to be surrounded with the first region 30, the first portion 31, and the second portion 32. In the first embodiment, the trench 180 is a line pattern and extends in, for example, the Y-axis direction.

The first region 30 includes a plane. The plane spreads in the X-axis direction and the Y-axis direction. As shown in FIG. 2B, the first region 30 has first to fourth end surfaces 41 to 44. The first and second end surfaces 41 and 42 each extend in the X-axis direction; and the second end surface 42 is separated from the first end surface 41. The third and fourth end surfaces 43 and 44 each extend in the Y-axis direction; and the fourth end surface 44 is separated from the third end surface 43. In the first embodiment, the first portion 31 extends along the fourth end surface 44 from the first end surface 41 to the second end surface 42. The second portion 32 extends along the third end surface 43 from the first end surface 41 to the second end surface 42. The trench 180 is provided from the first end surface 41 to the second end surface 42. The trench 180 is open to the outside of the second semiconductor chip 22 at each of the first and second end surfaces 41 and 42. The first and second portions 31 and 32 each are positioned between the base 1 and the first region 30. The second portion 32 is separated from the first portion 31 in the X-axis direction.

The first and second portions 31 and 32 may not contact the first to fourth end surfaces 41 to 44.

The first semiconductor chip 21 is positioned between the base 1 and the first region 30. For example, the first semiconductor chip 21 is separated from each of the first portion 31 and the second portion 32. The first semiconductor chip 21 is provided on the base 1 and is bonded to the base 1 by, for example, a bonding portion 21A.

As shown in FIG. 1A and FIG. 1B, the first region 30 is positioned between the first semiconductor chip 21 and the third semiconductor chip 23. The third, sixth, and fourth semiconductor chips 23, 26, and 24 each overhang in this order in the negative X-axis direction. The seventh and fifth semiconductor chips 27 and 25 each overhang in this order in the positive X-axis direction. At least one of the sixth semiconductor chips 26 may be positioned between the fourth semiconductor chip 24 and the third semiconductor chip 23. At least one of the seventh semiconductor chips 27 may be positioned between the fifth semiconductor chip 25 and the fourth semiconductor chip 24. The number of stacks of semiconductor chips is arbitrary. In the first embodiment, for example, the second, third, sixth, fourth, seventh, and fifth semiconductor chips 22, 23, 26, 24, 27, and 25 are stacked in the Z-axis direction in this order. These semiconductor chips may be bonded to each other respectively by bonding portions 23A, 26A, 24A, 27A, and 25A in order.

Figure 3A:
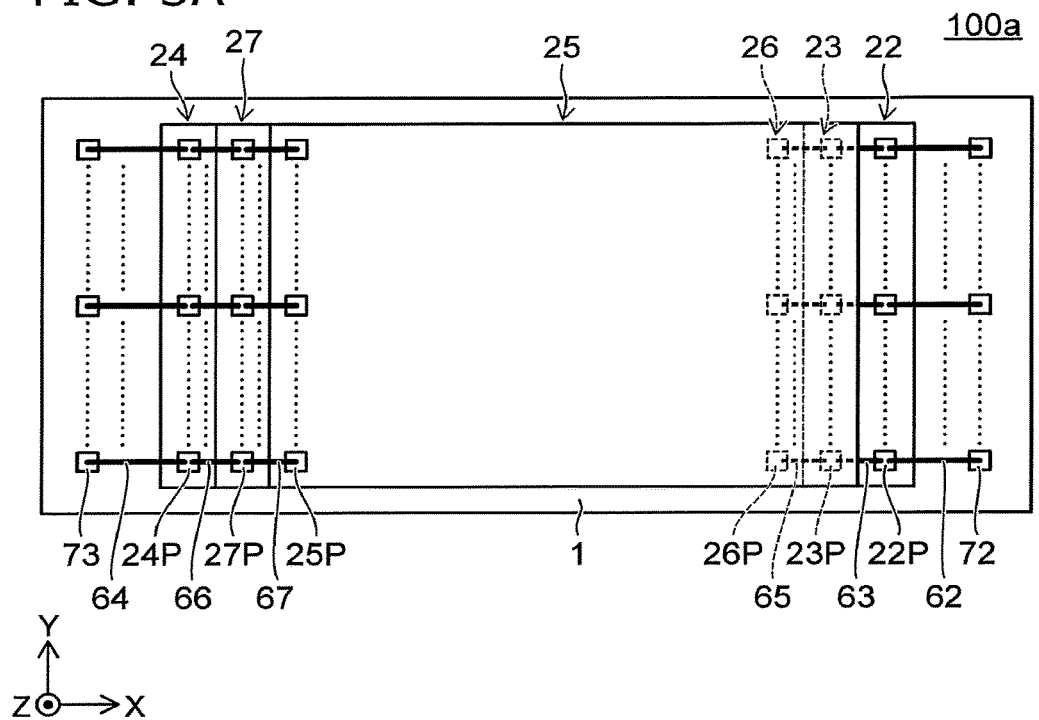
FIG. 3A and FIG. 3B are schematic plan views illustrating the semiconductor device according to the first embodiment.
Figure 3B:
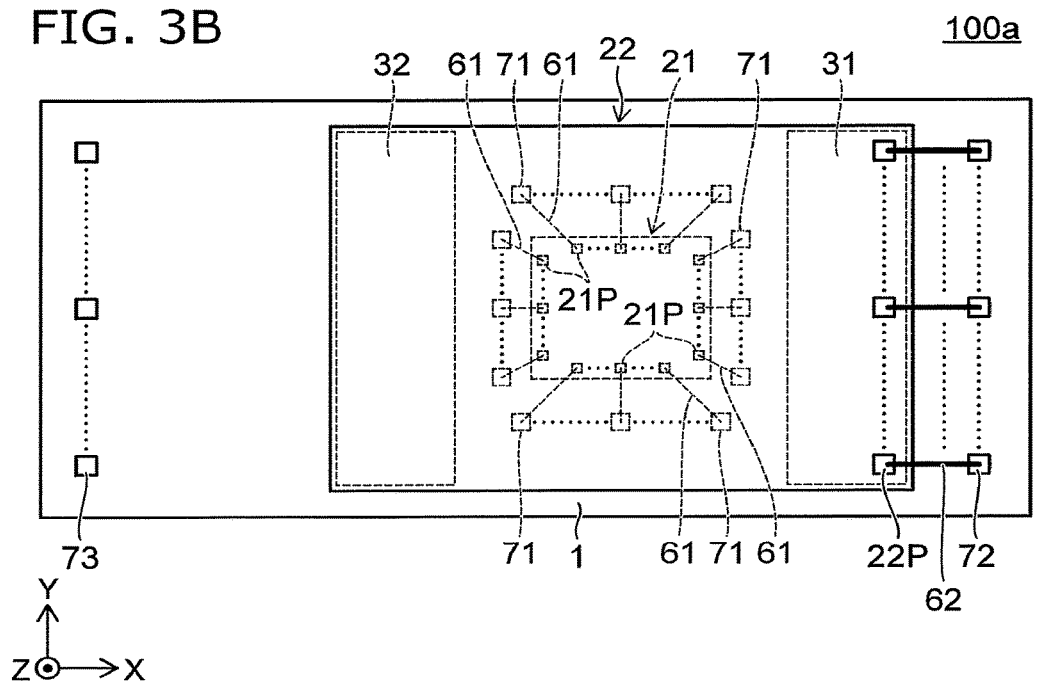

FIG. 3A and FIG. 3B are schematic plan views illustrating the semiconductor device according to the first embodiment. In FIG. 3A and FIG. 3B, the state before being insulatively sealed is shown. FIG. 3A shows the plane after the third to seventh semiconductor chips 23 to 27 are stacked; and FIG. 3B shows the plane before the third to seventh semiconductor chips 23 to 27 are stacked.

As shown in FIG. 3A and FIG. 3B, multiple first to third terminal electrodes 71 to 73 each are provided in the base 1

(the first terminal electrode 71 is not shown in FIG. 3A. For the first terminal electrode 71, refer to FIG. 1A to FIG. 2B). The first to third terminal electrodes 71 to 73 are electrically connected to at least one of the interconnects included in the interconnect group 11 (for the interconnect group 11, refer to FIG. 2A). The electrical connection state between the first to third terminal electrodes 71 to 73 and the interconnects included in the interconnect group 11 is set arbitrarily according to the semiconductor device. Multiple first to seventh pad electrodes 21P to 27P are provided respectively in the first to seventh semiconductor chips 21 to 27 (for the first pad electrode 21P, also refer to FIG. 2B). The first to seventh pad electrodes 21P to 27P are electrically connected respectively to the first to seventh semiconductor element portions D1 to D7 (for the first to seventh semiconductor element portions D1 to D7, refer to FIG. 1A, etc.). In the first embodiment, for example, the second pad electrode 22P is provided on the first portion 31 (referring to FIG. 3B). The first to third terminal electrodes 71 to 73 are electrically connected respectively to the first, second, and fourth pad electrodes 21P, 22P, and 24P via first, second, and fourth interconnect members 61, 62, and 64.

The second pad electrode 22P is electrically connected to the third pad electrode 23P via the third interconnect member 63. The third pad electrode 23P is electrically connected to the sixth pad electrode 26P via the fifth interconnect member 65. The fourth pad electrode 24P is electrically connected to the seventh pad electrode 27P via the sixth interconnect member 66. The seventh pad electrode 27P is electrically connected to the fifth pad electrode 25P via the seventh interconnect member 67. Thereby, for example, the first semiconductor chip 21 is electrically connected to the second to seventh semiconductor chips 22 to 27. The first to seventh interconnect members 61 to 67 each are, for example, bonding wires. The first to seventh interconnect members 61 to 67 are not limited to bonding wires; and another electrical connection method may be employed. For example, each or at least one of the first to seventh interconnect members 61 to 67 may include a bump electrode of a flip-chip semiconductor device. It is also possible to use bonding wires and bump electrodes in combination. For example, a bump electrode may be used as the first interconnect member 61, bonding wires may be used as the second to seventh interconnect members 62 to 67, etc.

The second semiconductor chip 22 is provided on the base 1 with the trench 180 oriented toward the base 1. According to the first embodiment, the trench 180 that has, for example, a line pattern configuration is obtained between the first region 30 and the base 1. The first semiconductor chip 21 is positioned in the trench 180 on the base 1. For example, the trench 180 of the first embodiment has two open-end portions. As shown in FIG. 1B, for example, the insulative sealing member 8 can be filled into such a trench 180. For example, it is possible to further provide the insulative sealing member 8 at least between the first portion 31 and the second portion 32. For example, the insulative sealing member 8 further surrounds the first semiconductor chip 21 inside the trench 180.

FIG. 4A is a schematic cross-sectional view illustrating a semiconductor device according to a reference example. FIG. 4B is a schematic cross-sectional view illustrating the semiconductor device according to the first embodiment.

As shown in FIG. 4A, the semiconductor device 100r according to the reference example is an example in which a low-elastic resin material 300 is provided on the first semiconductor chip 21 and the first interconnect member 61; and a second semiconductor chip 22r is mounted on the low-elastic resin material 300. The semiconductor device 100r has a structure in which the first interconnect member 61 is buried in the low-elastic resin material 300. For example, to maintain the loop shape of the first interconnect member 61, the low-elastic resin material 300 includes, for example, an insulative resin material that has a low viscosity and softens easily due to heat. For example, the elastic modulus of the low-elastic resin material 300 is low compared to that of the wire interconnect material of the first to seventh interconnect members 61 to 67. Therefore, the low-elastic resin material 300 deforms easily compared to the wire interconnect material. Moreover, the thickness in the Z-axis direction of the low-elastic resin material 300 is set to be sufficiently thicker than the height of the first interconnect member 61. Or, in the case where a flip-chip connection of the first semiconductor chip 21 is used, the thickness in the Z-axis direction is set to be sufficiently thicker than the height of the first semiconductor chip 21. For example, this is to suppress the deformation and breaking of the first interconnect member 61. In the semiconductor device 100r, if a thickness t22r in the Z-axis direction of the second semiconductor chip 22r is set to be thin, for example, the following circumstances occur:

(1) There is a possibility that vibrations may occur when performing wire bonding of the second interconnect member 62 due to flexing of the second semiconductor chip 22r.

(2) There is a possibility that the second semiconductor chip 22r may be warped by heat in, for example, a heating process.

Therefore, the thickness t22r must be set to be thick. In the semiconductor device 100r, for example, a thickness H1 in the Z-axis direction above the base 1 easily becomes thick. Accordingly, in the semiconductor device 100r, it is difficult to reduce the thickness of the package.

Conversely, in the semiconductor device 100a according to the first embodiment, for example, instead of the low-elastic resin material 300, the first portion 31 and the second portion 32 are provided in the second semiconductor chip 22. For example, it is assumed that the thickness in the Z-axis direction of the low-elastic resin material 300 and the thickness in the Z-axis direction of the first portion 31 and the second portion 32 are set to be substantially equal (including, for example, the thickness in the Z-axis direction of the bonding portion 21A).

The first portion 31 and the second portion 32 are a semiconductor substrate, e.g., a silicon substrate. Therefore, the first portion 31 and the second portion 32 do not deform easily compared to the low-elastic resin material 300. The region of the second semiconductor chip 22 of the first embodiment that corresponds to the second semiconductor chip 22r of the reference example is the first region 30. It is possible to set a thickness t30 in the Z-axis direction of the first region 30 to be thinner than the thickness t22r while suppressing the "flexing" and the "warp." Accordingly, according to the semiconductor device 100a according to the first embodiment, for example, a thickness H2 in the Z-axis direction above the base 1 can be thin compared to the thickness H1.

Thus, according to the first embodiment, a semiconductor device can be provided in which it is possible to reduce the thickness of the package. Further, the number of stacks of semiconductor chips also can be increased while suppressing the increase of the thickness of the package.

For example, the low-elastic resin material 300 is expensive compared to a DAF material having a thickness of about 5 to 10 μm. The manufacturing cost of the semiconductor device 100r increases easily. However, for example, the semiconductor device 100a of the first embodiment does not need to use the low-elastic resin material 300. For example, it is possible to use a DAF material as the bonding portion 21A of the semiconductor device 100a. Accordingly, according to the semiconductor device 100a according to the first embodiment, the increase of the manufacturing cost also can be suppressed compared to the semiconductor device 100r according to the reference example.

Further, an advantage can be obtained in that, for example, the second interconnect member 62 and/or the fourth interconnect member 64 do not break easily in the wire bonding process and/or the resin sealing process when packaging.

This is because the second interconnect member 62 that is bonded to the second semiconductor chip 22r shown in FIG. 4A and the fourth interconnect member 64 that is bonded to the fourth semiconductor chip 24 of FIG. 1A in the case where the low-elastic resin material 300 is applied easily undergo flexing and/or vibrations when bonding because the rigidity of the low-elastic resin material 300 shown in FIG. 4A is low. Therefore, the bonding energy (the load and/or the ultrasonic wave) that is applied from the bonding apparatus is easily in a state of being unstable or insufficient. Therefore, in the semiconductor device 100r, a sufficient bonding strength is not obtained easily for the bonding strength between the second interconnect member 62 and the second pad electrode 22P and the bonding strength between the fourth interconnect member 64 and the fourth pad electrode 24P.

Conversely, in the case of the second interconnect member 62 that is bonded to the second semiconductor chip 22 shown in FIG. 4B and the fourth interconnect member 64 that is bonded to the fourth semiconductor chip 24 of FIG. 1A, the first portion 31 and the second portion 32 each have high rigidities; and flexing does not occur easily. Accordingly, in the semiconductor device 100a, the bonding energy that is applied from the bonding apparatus can be obtained sufficiently compared to the semiconductor device 100r; and the bonding strength between the second interconnect member 62 and the second pad electrode 22P and the bonding strength between the fourth interconnect member 64 and the fourth pad electrode 24P each can be high.

For example, the thermal expansion coefficient (Coefficient of Thermal Expansion (CTE)) of the low-elastic resin material 300 is large compared to that of silicon. Therefore, for example, there is a possibility that the low-elastic resin material 300 may swell in the heating process; and cracks may initiate in the second semiconductor chip 22r, etc.

Conversely, in the first embodiment, for example, it is unnecessary for the insulative sealing member to be filled in the process of performing thermal curing of the bonding portion 21A, etc. Accordingly, the occurrence of cracks in the second semiconductor chip 22, etc., can be suppressed.

The second semiconductor chip 22 includes the first portion 31 and the second portion 32 in addition to the first region 30. The thickness H2 in the Z-axis direction of the second semiconductor chip 22 can be thicker than the thickness t22r in the Z-axis direction of the second semiconductor chip 22r of the reference example. Therefore, for the semiconductor device 100a, for example, compared to the semiconductor device 100r of the reference example, it is also possible to improve the rigidity and prevent warp.

In the first embodiment as shown in FIG. 3B, for example, the second pad electrode 22P is provided on the first portion 31. The first and second portions 31 and 32 are a semiconductor substrate, e.g., a silicon substrate as-is. The thicknesses in the Z-axis direction of the first and second portions 31 and 32 are thicker than the thickness in the Z-axis direction of the portion where the trench 180 is provided. Moreover, the first and second portions 31 and 32 are disposed on the base 1 without the trench 180 being interposed. Accordingly, compared to the portion where the trench 180 is provided, the thickness in the Z-axis direction is thick and the rigidity is high for the portions of the first and second portions 31 and 32. Compared to the portion of the second semiconductor chip 22 where the trench 180 is provided, the portions of the first and second portions 31 and 32 are portions that do not deform easily.

Thus, for example, the second pad electrode 22P is disposed on at least one of the first or second portion 31 or 32. Thereby, for example, in the wire bonding process, the deformation and/or flexing of the second semiconductor chip 22 and the accompanying occurrence of vibrations can be suppressed; and the conditions necessary for the bonding strength can be satisfied. Accordingly, for the second semiconductor chip 22 that has the trench 180, an advantage can be further obtained in that the decrease of the bonding strength between the second pad electrode 22P and the second interconnect member 62 can be suppressed.

Also, for example, the advantages recited above can be improved further by not disposing the second pad electrode 22P in the portion of the second semiconductor chip 22 on the trench 180.

Other technical effects obtained from the embodiment are described as appropriate in the modifications and the other embodiments described below.

First Embodiment: First Modification

Figure 5A:
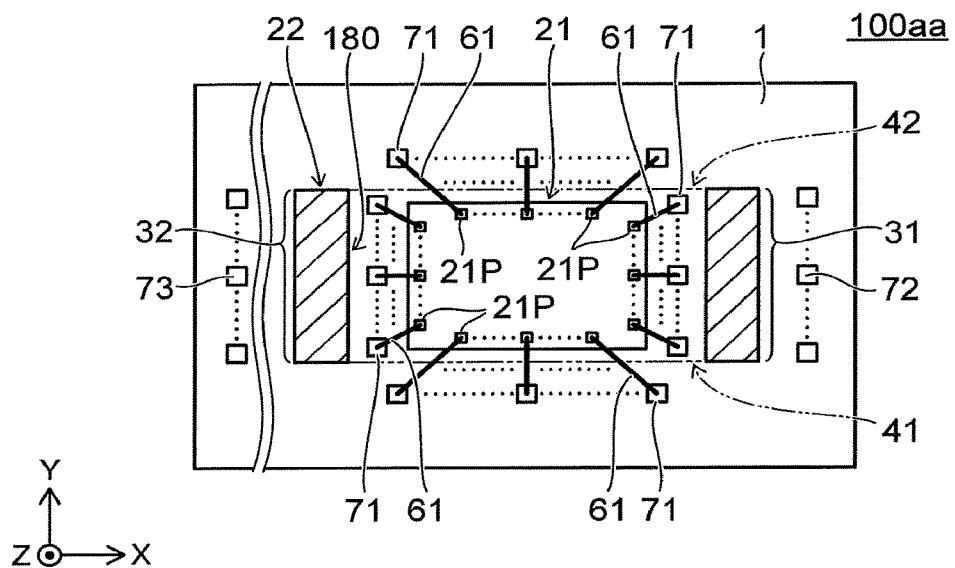
FIG. 5A is a schematic plan view illustrating a semiconductor device according to a first modification of the first embodiment.

FIG. 5A is a schematic plan view illustrating a semiconductor device according to a first modification of the first embodiment. In FIG. 5A, a portion of the second semiconductor chip 22 is shown as a cross section.

As shown in FIG. 5A, when viewed from a direction along the Z-axis direction, it is unnecessary for all of the first terminal electrodes 71 to be covered with the second semiconductor chip 22. For example, the second semiconductor chip 22 of the semiconductor device 100aa according to the first modification has the trench 180 that reaches the second end surface 42 from the first end surface 41 along the Y-axis direction. In the case of such a semiconductor device 100aa, it is possible to dispose some of the first terminal electrodes 71 on the base 1 to be positioned outside at least one of the first or second end surface 41 or 42. In FIG. 5A, an example is shown in which some of the first terminal electrodes 71 are disposed on the base 1 to be positioned outside each of the first and second end surfaces 41 and 42.

According to the first embodiment, for example, the second semiconductor chip 22 has the trench 180 that reaches the second end surface 42 from the first end surface 41. Accordingly, as shown in the first modification, for example, another advantage also can be obtained in that the degrees of freedom of the arrangement on the base 1 of the first terminal electrodes 71 can be increased.

First Embodiment: Second Modification

Figure 5B:
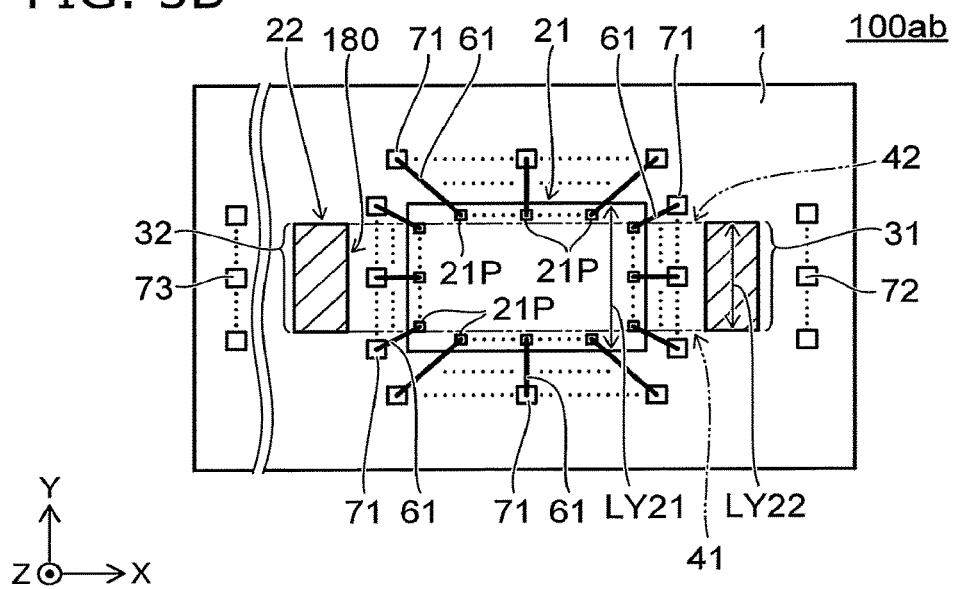
FIG. 5B is a schematic plan view illustrating a semiconductor device according to a second modification of the first embodiment.

FIG. 5B is a schematic plan view illustrating a semiconductor device according to a second modification of the first embodiment. In FIG. 5B, a portion of the second semiconductor chip 22 is shown as a cross section.

As shown in FIG. 5B, when viewed from a direction along the Z-axis direction, it is unnecessary for the entire first semiconductor chip 21 to be covered with the second semiconductor chip 22. For example, the first semiconductor chip 21 may be disposed on the base 1 so that at least one of the two end surfaces along the X-axis direction of the first semiconductor chip 21 is positioned outside at least one of the first or second end surface 41 or 42.

In the semiconductor device 100ab according to the second modification, a length LY21 in the Y-axis direction of the first semiconductor chip 21 is longer than a length LY22 in the Y-axis direction of the second semiconductor chip 22. According to the first embodiment, for example, the second semiconductor chip 22 has the trench 180 that reaches the second end surface 42 from the first end surface 41. Therefore, the first semiconductor chip 21 can be disposed on the base 1 even in the case where the length LY21 is longer than the length LY22. While having the same relationship as this relationship, the second semiconductor chip 22 can be disposed on the base 1 even in the case where the length LY22 is shorter than the length LY21.

According to the first embodiment, as shown in the second modification, the constraints of the chips that can be disposed also can be relaxed. Therefore, for example, an advantage also can be obtained in that modifications of the chip sizes of the first and second semiconductor chips 21 and 22 also can be accommodated easily.

First Embodiment: Third Modification

Figure 6A:
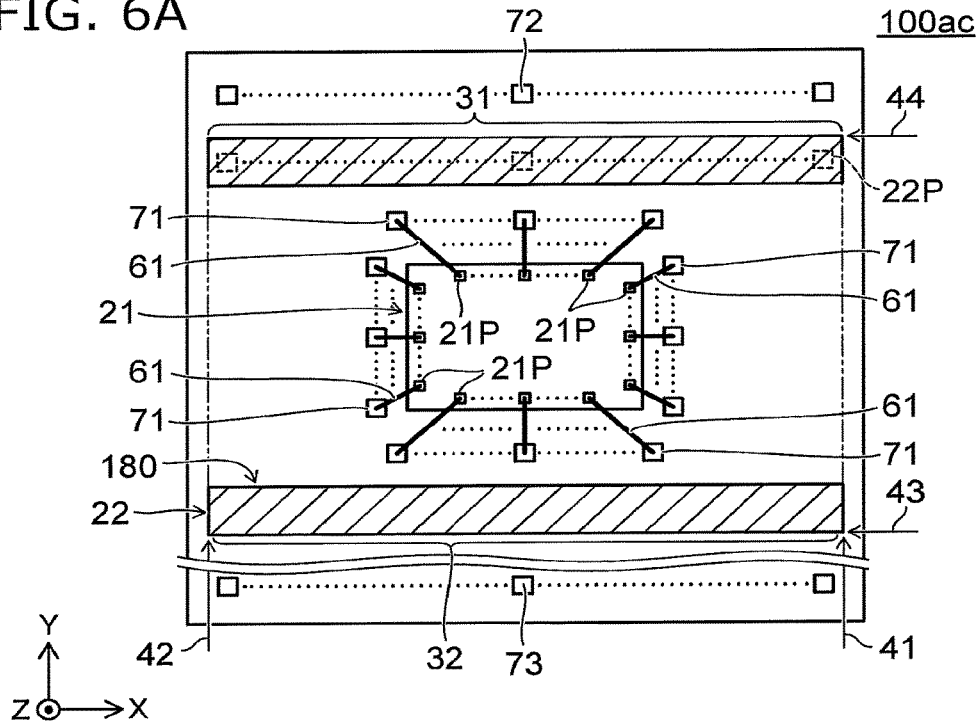
FIG. 6A is a schematic plan view illustrating a semiconductor device according to a third modification of the first embodiment.

FIG. 6A is a schematic plan view illustrating a semiconductor device according to a third modification of the first embodiment. In FIG. 6A, a portion of the second semiconductor chip 22 is shown as a cross section.

As shown in FIG. 6A, the configuration of the second semiconductor chip 22 when viewed from a direction along the Z-axis direction is a rectangle having a major axis and a minor axis. In such a case, it is also possible to provide the first and second portions 31 and 32 along the major axis. The semiconductor chip 22 of the semiconductor device 100ac according to the third modification has a major axis along the X-axis direction and a minor axis along the Y-axis direction. The first and second portions 31 and 32 each are aligned with the X-axis direction.

According to the first embodiment, the decrease of the rigidity of the second semiconductor chip 22 can be relaxed. As in the third modification, by providing each of the first and second portions 31 and 32 along the major-axis direction of the second semiconductor chip 22, it is possible to better obtain the effect in which the decrease of the rigidity can be relaxed.

In the third modification as well, for example, it is sufficient for the second pad electrode 22P to be disposed on at least one of the first or second portion 31 or 32. Thereby, even in the case where the second semiconductor chip 22 includes the first region 30 having a thin thickness in the Z-axis direction, the decrease of the bonding strength between the second pad electrode 22P and the second interconnect member 62 can be suppressed. In the third modification, while maintaining such an effect, the number of the second pad electrodes 22P can be increased compared to the case where the first and second portions 31 and 32 are aligned with the minor-axis direction.

First Embodiment: Fourth Modification

Figure 6B:
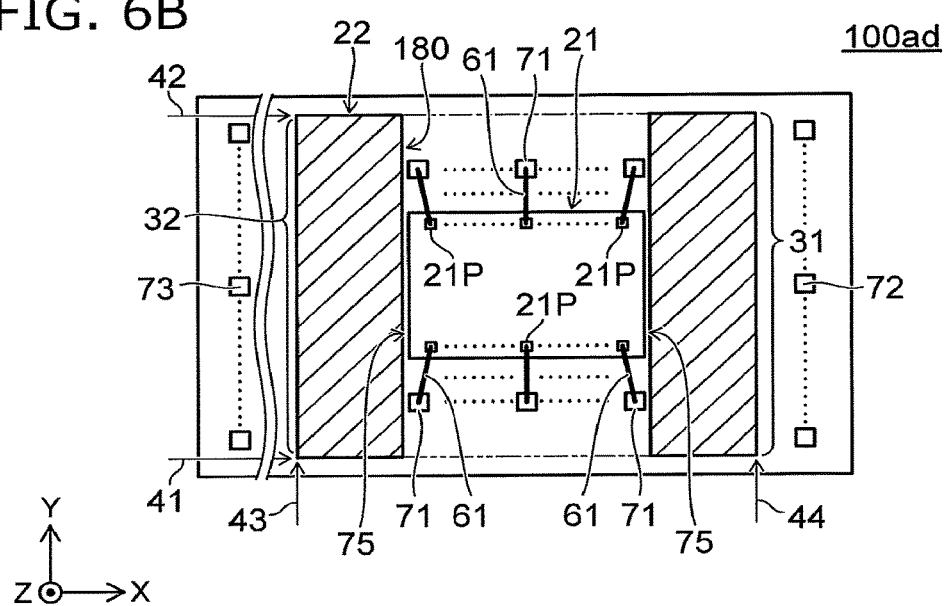
FIG. 6B is a schematic plan view illustrating a semiconductor device according to a fourth modification of the first embodiment.

FIG. 6B is a schematic plan view illustrating a semiconductor device according to a fourth modification of the first embodiment. In FIG. 6B, a portion of the second semiconductor chip 22 is shown as a cross section.

As shown in FIG. 6B, the first terminal electrodes 71 may not be disposed in one or both of the region between the first portion 31 and the first semiconductor chip 21 and the region between the second portion 32 and the first semiconductor chip 21. In FIG. 6B, an example is shown in which the first terminal electrodes 71 are not disposed in either of the region between the first portion 31 and the first semiconductor chip 21 or the region between the second portion 32 and the first semiconductor chip 21.

When viewed from a direction along the Z-axis direction, the first semiconductor chip 21 is a quadrilateral having four sides. For example, in the fourth modification, the first pad electrodes 21P are disposed in the first semiconductor chip 21 to correspond to one to three sides of the first semiconductor chip 21. In FIG. 6B, an example is shown in which the first pad electrodes 21P are disposed in the first semiconductor chip 21 to correspond to a pair of sides along the X-axis direction. The first pad electrodes 21P are not disposed in the regions adjacent to the pair of sides along the Y-axis direction of the first semiconductor chip 21. The pair of sides along the Y-axis direction is respectively adjacent to the first and second portions 31 and 32.

For example, the first terminal electrodes 71 are disposed in the base 1 to correspond to the one to three sides recited above where the first pad electrodes 21P of the first semiconductor chip 21 are disposed. In FIG. 6B, an example is shown in which the first terminal electrodes 71 are disposed in the base 1 to correspond to the pair along the X-axis direction of the first semiconductor chip 21. The first terminal electrodes 71 are not disposed respectively between the first and second portions 31 and 32 and the pair of sides along the Y-axis direction of the first semiconductor chip 21.

For example, the first interconnect members 61 electrically connect the first pad electrodes 21P and the first terminal electrodes 71 by straddling the one to three sides recited above where the first pad electrodes 21P are disposed. In FIG. 6B, an example is shown in which the first pad electrodes 21P and the first terminal electrodes 71 are electrically connected by the first interconnect members 61 straddling the pair of sides along the X-axis direction of the first semiconductor chip 21. None of the first interconnect members 61 straddle the pair of sides along the Y-axis direction of the first semiconductor chip 21.

In the fourth modification, a clearance 75 along the Y-axis direction exists respectively between at least one of the first and second portions 31 and 32 and the pair of sides along the Y-axis direction of the first semiconductor chip 21. For example, the insulative sealing member 8 shown in FIG. 1B is provided in the clearance 75 without, for example, including the first terminal electrodes 71 and the first interconnect members 61. It is also possible for the clearance 75 to be, for example, an air gap without being filled with the insulative sealing member 8. However, to avoid discrepancies due to the expansion of the air by heating, it is favorable to fill the clearance 75 with a material such as an under-fill, an insulating resin material, etc.

In the fourth modification, the length in the X-axis direction of the second semiconductor chip 22 can be shortened by reducing, for example, the length along the X-axis direction of the clearance 75. Accordingly, an advantage can be obtained in that the size of the second semiconductor chip 22 can be reduced. In the fourth modification in which the size of the second semiconductor chip 22 can be reduced, for example, it is also possible to reduce the size of the base 1. For example, such a fourth modification is advantageous to downsize the semiconductor package.

By reducing, for example, the length along the X-axis direction of the clearance 75, the length in the X-axis direction of at least one of the first or second portion 31 or 32 can be lengthened without modifying the length in the X-axis direction of the second semiconductor chip 22. Accordingly, in the fourth modification, it is also possible to further increase the rigidity of the second semiconductor chip 22.

It is also possible to eliminate the clearance 75. In the fourth modification, for example, at least one of the first or second portion 31 or 32 may contact the first semiconductor chip 21.

Second Embodiment

Figure 7A:
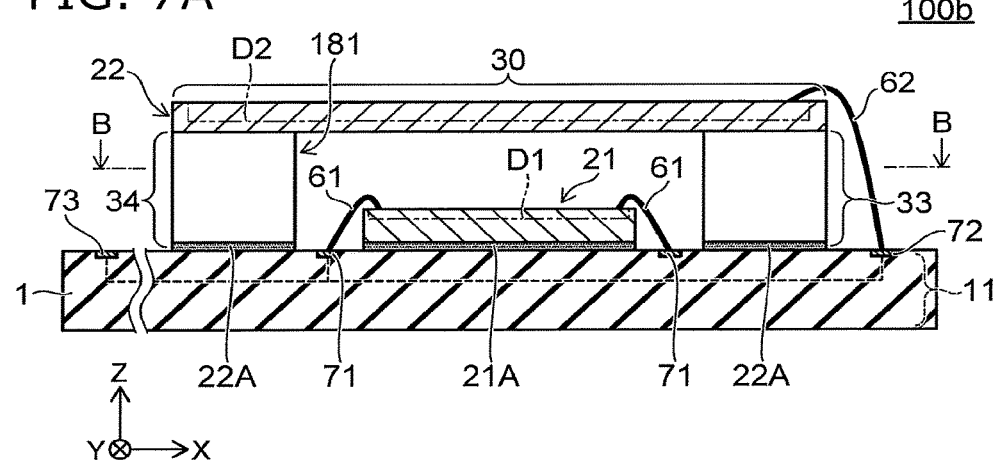
FIG. 7A is a schematic cross-sectional view illustrating a semiconductor device according to a second embodiment.
Figure 7B:
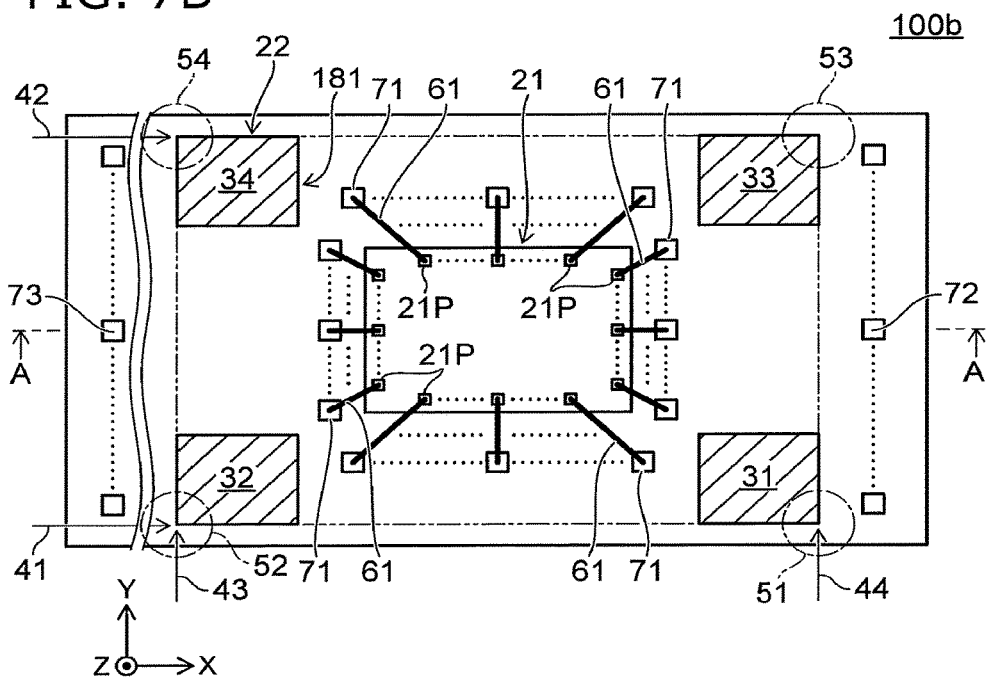
FIG. 7B is a schematic plan view illustrating the semiconductor device according to the second embodiment.

FIG. 7A is a schematic cross-sectional view illustrating a semiconductor device according to a second embodiment. FIG. 7B is a schematic plan view illustrating the semiconductor device according to the second embodiment. The base 1 and the first and second semiconductor chips 21 and 22 are shown in FIG. 7A and FIG. 7B. In FIG. 7B, a portion of the second semiconductor chip 22 is shown as a cross section. The cross section shown in FIG. 7B is along line B-B in FIG. 7A. The cross section shown in FIG. 7A is along line A-A in FIG. 7B.

As shown in FIG. 7A and FIG. 7B, compared to the second semiconductor chip 22 of the first embodiment, the second semiconductor chip 22 of the semiconductor device 100b according to the second embodiment further includes a third portion 33 and a fourth portion 34.

The third portion 33 is continuous with the first region 30. The third portion 33 is separated from each of the first portion 31 and the second portion 32 in the Y-axis direction. The fourth portion 34 is continuous with the first region 30. The fourth portion 34 is separated from the third portion in the X-axis direction and is separated from each of the first portion 31 and the second portion 32 in the Y-axis direction. For example, the first semiconductor chip 21 is separated from each of the third portion 33 and the fourth portion 34.

The second semiconductor chip 22 has first to fourth corners 51 to 54. The first end surface 41 and the fourth end surface 44 cross at the first corner 51. The first end surface 41 and the third end surface 43 cross at the second corner 52.

The second end surface 42 and the fourth end surface 44 cross at the third corner 53. The second end surface 42 and the third end surface 43 cross at the fourth corner 54. For example, the first to fourth portions 31 to 34 are positioned respectively in the regions including the first to fourth corners 51 to 54.

The first to fourth portions 31 to 34 may not contact the first to fourth corners 51 to 54.

A trench 181 of the second semiconductor chip 22 of the second embodiment is a cross pattern and extends in each of the X-axis direction and the Y-axis direction. The trench 181 has four end portions. The four end portions open to the outside of the second semiconductor chip 22 respectively at the first to fourth end surfaces 41 to 44. According to the second embodiment, for example, the trench 181 that has the cross pattern configuration between the first region 30 and the base 1 is obtained. The first semiconductor chip 21 is positioned in the trench 181 on the base 1.

The second semiconductor chip 22 may include, for example, the first to fourth portions 31 to 34. According to the second embodiment, the trench 181 that has four open-end portions between the first region 30 and the base 1 is obtained. According to the second embodiment including such a trench 181, for example, compared to the first embodiment, there are more filling paths of the resin; therefore, an advantage can be obtained in that the insulative sealing member 8 is filled more easily into the trench 181.

In the second embodiment as well, modifications similar to the first to fourth modifications of the first embodiment are possible.

Third Embodiment

Figure 8A:
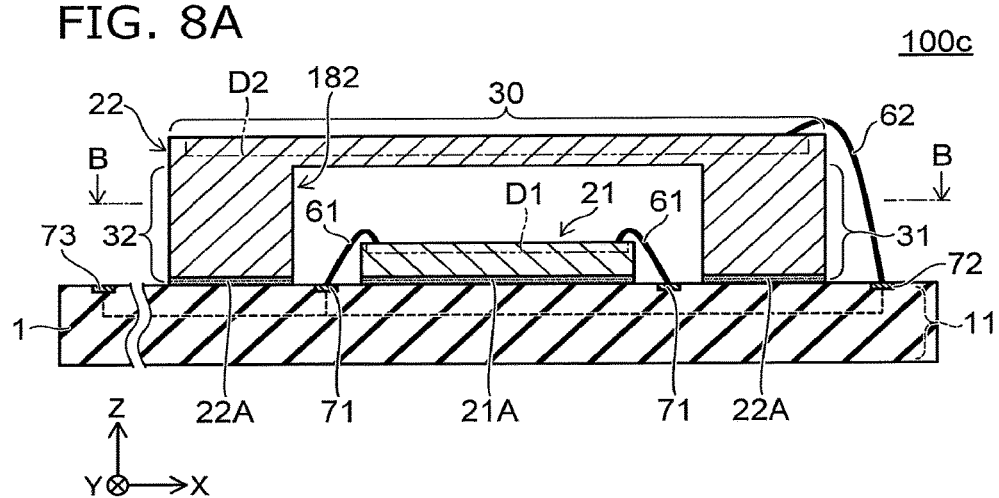
FIG. 8A is a schematic cross-sectional view illustrating a semiconductor device according to a third embodiment.
Figure 8B:
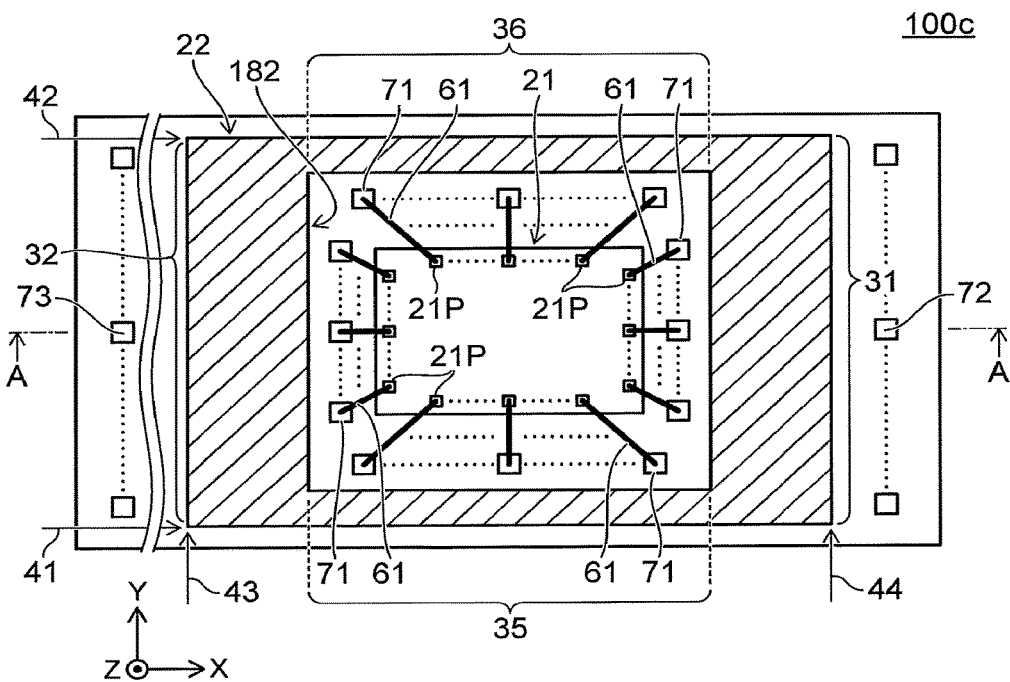
FIG. 8B is a schematic plan view illustrating the semiconductor device according to the third embodiment.

FIG. 8A is a schematic cross-sectional view illustrating a semiconductor device according to a third embodiment. FIG. 8B is a schematic plan view illustrating the semiconductor device according to the third embodiment. The base 1 and the first and second semiconductor chips 21 and 22 are shown in FIG. 8A and FIG. 8B. In FIG. 8B, a portion of the second semiconductor chip 22 is shown as a cross section. The cross section shown in FIG. 8B is along line B-B in FIG. 8A. The cross section shown in FIG. 8A is along line A-A in FIG. 8B.

As shown in FIG. 8A and FIG. 8B, compared to the second semiconductor chip 22 of the first embodiment, the second semiconductor chip 22 of the semiconductor device 100c according to the third embodiment further includes a fifth portion 35 and a sixth portion 36.

The fifth portion 35 is continuous with the first region 30, the first portion 31, and the second portion 32. The sixth portion 36 is separated from the fifth portion 35 in the Y-axis direction and is continuous with the first region 30, the first portion 31, and the second portion 32. The fifth portion 35 extends along the first end surface 41 from the first portion 31 to the second portion 32. The sixth portion 36 extends along the second end surface 42 from the first portion 31 to the second portion 32.

The second semiconductor chip 22 of the third embodiment has a recess 182 having the first, second, fifth, and sixth portions 31, 32, 35, and 36 as walls and the first region 30 as a bottom. The first semiconductor chip 21 is provided on the base 1 with the recess 182 oriented toward the base 1. According to the third embodiment, for example, a cavity between the first region 30 and the base 1 is obtained. The first semiconductor chip 21 is positioned inside the cavity on the base 1.

The second semiconductor chip 22 may include, for example, a ring portion including the first, second, fifth, and sixth portions 31, 32, 35, and 36. For example, the ring portion is aligned with the first to fourth end surfaces 41 to 44. According to the third embodiment, compared to, for example, the first and second embodiments, an advantage can be obtained in that the rigidity of the second semiconductor chip 22 is increased further because the second semiconductor chip 22 includes the ring portion.

The first, second, fifth, and sixth portions 31, 32, 35, and 36 may not contact the first to fourth end surfaces 41 to 44. Also, in the third embodiment, for example, the insulative sealing member 8 may be filled or may not be filled into the cavity. In the case where the interior of the cavity is not filled with the insulative sealing member 8, the interior of the cavity is, for example, an air gap. Further, in the third embodiment, modifications similar to the third and fourth modifications of the first embodiment are possible. For example, in the third embodiment, in the case where the clearance 75 is provided, it is also possible for the clearance 75 to be, for example, an air gap without being filled with, for example, the insulative sealing member 8. However, to prevent discrepancies due to the expansion of the air by heating as well, it is desirable to seal the clearance 75 with an under-fill, an insulating resin material, etc. It is also possible to eliminate this circumstance by sealing in a vacuum.

Fourth Embodiment

FIG. 9A to FIG. 9G are schematic perspective views in order of the processes, illustrating a method for manufacturing a semiconductor device according to a fourth embodiment. FIG. 10A to FIG. 10H are schematic cross-sectional views in order of the processes, illustrating the method for manufacturing the semiconductor device according to the fourth embodiment. For example, the method for manufacturing the second semiconductor chip 22 is illustrated in the fourth embodiment.

Figure 9A:
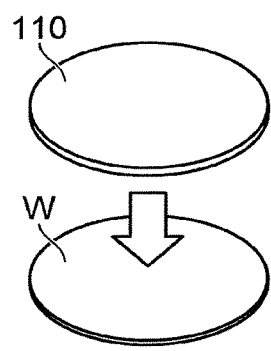
FIG. 9A to FIG. 9G are schematic perspective views in order of the processes, illustrating a method for manufacturing a semiconductor device according to a fourth embodiment.
Figure 10A:
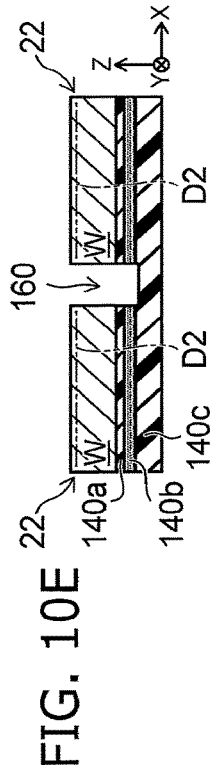
FIG. 10A to FIG. 10H are schematic cross-sectional views in order of the processes, illustrating the method for manufacturing the semiconductor device according to the fourth embodiment.

As shown in FIG. 9A and FIG. 10A, a silicon wafer W (called the wafer hereinbelow) is prepared in which the multiple second semiconductor element portions D2 are formed. The wafer W has the first surface that includes the second semiconductor element portions D2, and the second surface that is separated from the first surface in the Z-axis direction. Continuing, a surface protection tape 110 is bonded on the first surface of the wafer W.

Figure 9B:
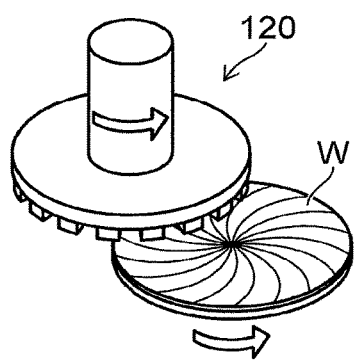
Figure 10B:
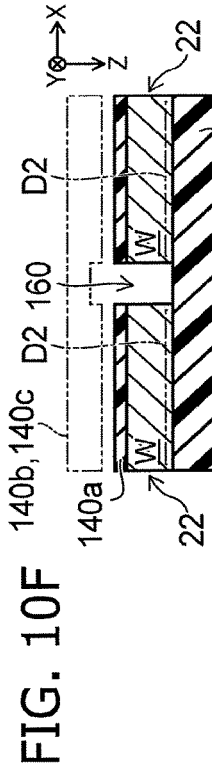

Then, as shown in FIG. 9B and FIG. 10B, the wafer W is inverted; and the second surface of the wafer W is caused to recede by polishing using a grinding wheel 120. This process is a so-called BSG (Back Side grinding) process.

Figure 9C:
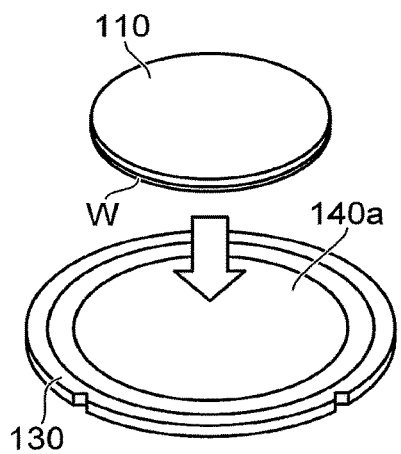
Figure 10C:
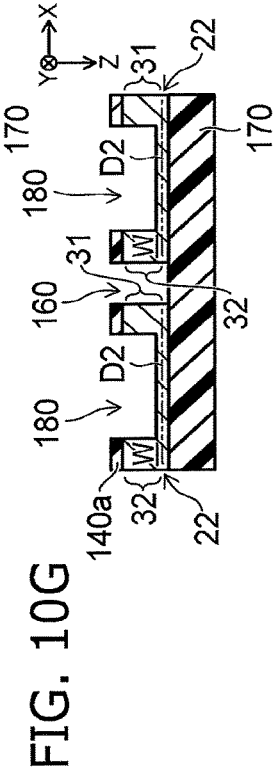

Continuing as shown in FIG. 9C and FIG. 10C, the wafer W is inverted; and the second surface of the wafer W is bonded to a bonding resin bonded on a dicing ring 130. One example of the bonding resin is a DAF (Die Attach Film) 140a. For example, the DAF 140a is bonded to a base material 140c by a bonding resin 140b. The base material 140c is, for example, a resin material such as PET (Poly Ethylene Terephthalate), etc.

Figure 9D:
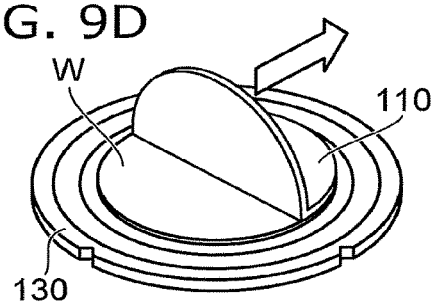
Figure 9E:
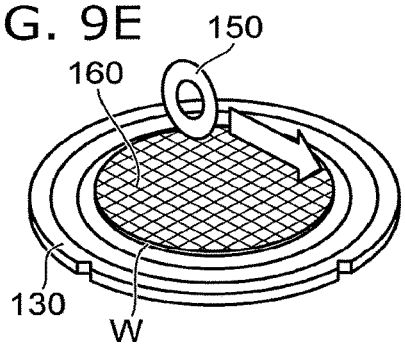
Figure 10D:
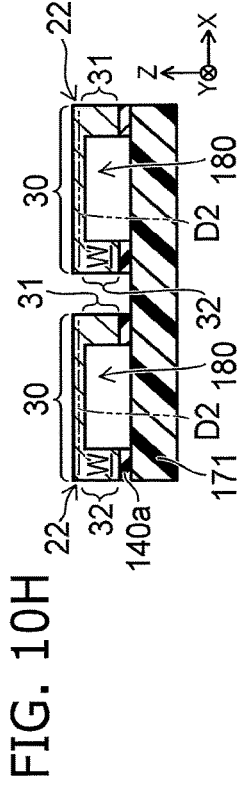
Figure 10E:
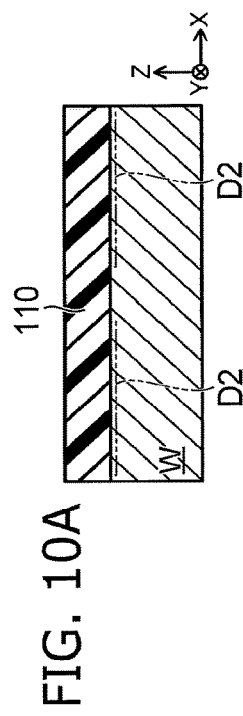

Then, as shown in FIG. 9D and FIG. 10D, the surface protection tape 110 is peeled from the first surface of the wafer W Continuing as shown in FIG. 9E and FIG. 10E, the wafer W is diced using a blade 150. A dicing line 160 is formed in the wafer W. The dicing line 160 is formed along each of the X-axis direction and the Y-axis direction. The wafer W is divided into the multiple second semiconductor chips 22.

Figure 9F:
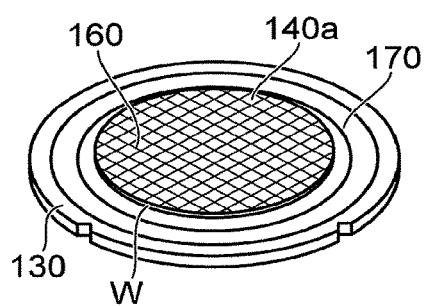
Figure 10F:
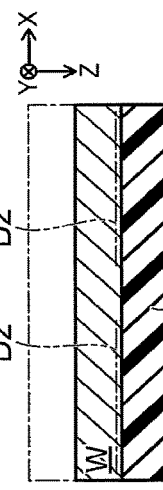

Then, as shown in FIG. 9F and FIG. 10F, for example, ultraviolet is irradiated; and the adhesive force of the bonding resin 140b is reduced. Continuing, the wafer W is inverted; and the first surface of the wafer W is bonded to a first dicing tape 170 provided on the dicing ring 130. Continuing, for example, the bonding resin 140b and the base material 140c are peeled from the DAF 140a.

Figure 9G:
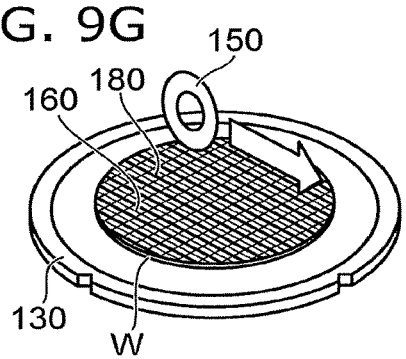
Figure 10G:
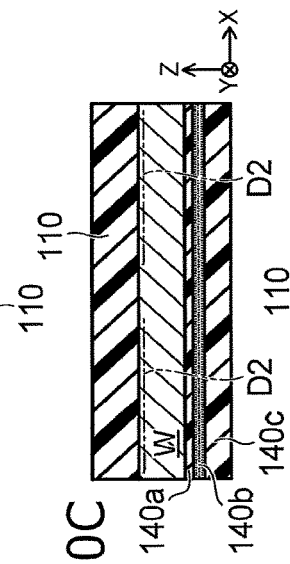

Then, as shown in FIG. 9G and FIG. 10G, a recess is formed in the wafer W divided into the multiple second semiconductor chips 22. In the embodiment, the trench 180 is formed in the wafer W. When forming the trench 180, for example, the blade 150 may pass through the wafer W several times along the Y-axis direction to cause the trench 180 to have the prescribed width.

Figure 10H:
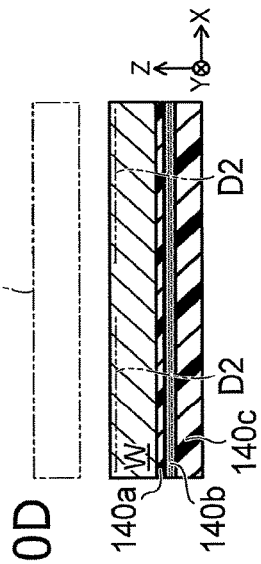

Continuing as shown in FIG. 10H, the second semiconductor chips 22 are inverted; and the DAF 140a is bonded to a second dicing tape 171. Subsequently, the adhesive force is reduced by irradiating ultraviolet on the second dicing tape 171, etc.; and the second semiconductor chips 22 are picked up from the second dicing tape 171 and bonded on the base 1.

For example, the second semiconductor chip 22 of the first embodiment can be manufactured by forming the trench 180 using, for example, the blade 150.

In the case where the second semiconductor chip 22 of the second embodiment is manufactured, for example, it is sufficient to form the trench 181 having a cross pattern in the wafer W by forming trenches in each of the X-axis direction and the Y-axis direction in the processes shown in FIG. 9G and FIG. 10G In the case where the second semiconductor chip 22 of the third embodiment is manufactured, for example, it is sufficient to form the recesses 182 in the wafer W by forming windows in the DAF 140a corresponding to the recesses 182 by irradiating ultraviolet only in the region other than the windows, selectively peeling the DAF 140a, subsequently performing etching using the DAF 140a as a mask, and performing RIE, sand blasting, wet etching, or the like of the wafer W.

The method for manufacturing the second semiconductor chip 22 in the second and third embodiments also is applied similarly to the fifth and sixth embodiments described below.

Fifth Embodiment

FIG. 11A to FIG. 11G are schematic perspective views in order of the processes, illustrating a method for manufacturing a semiconductor device according to a fifth embodiment. FIG. 12A to FIG. 12H are schematic cross-sectional views in order of the processes, illustrating the method for manufacturing the semiconductor device according to the fifth embodiment. For example, another method for manufacturing the first semiconductor chip 21 is illustrated in the fifth embodiment.

Figure 11A:
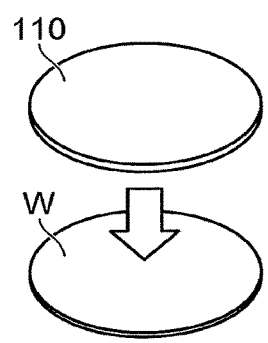
FIG. 11A to FIG. 11G are schematic perspective views in order of the processes, illustrating a method for manufacturing a semiconductor device according to a fifth embodiment.
Figure 11B:
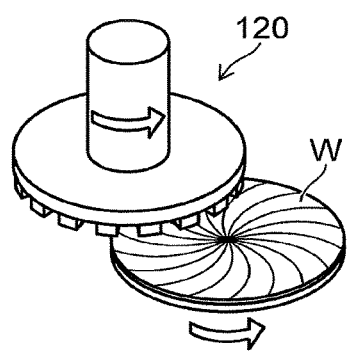
Figure 11C:
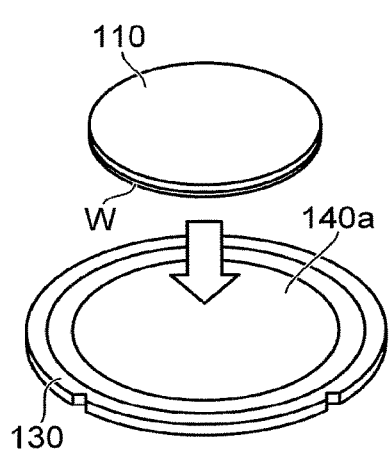
Figure 11D:
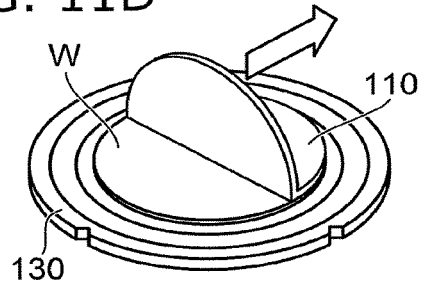
Figure 12A:
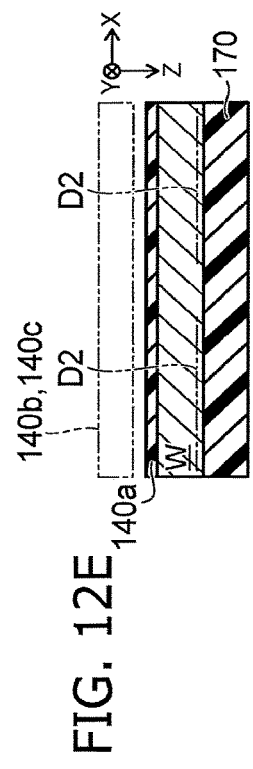
FIG. 12A to FIG. 12H are schematic cross-sectional views in order of the processes, illustrating the method for manufacturing the semiconductor device according to the fifth embodiment.
Figure 12B:
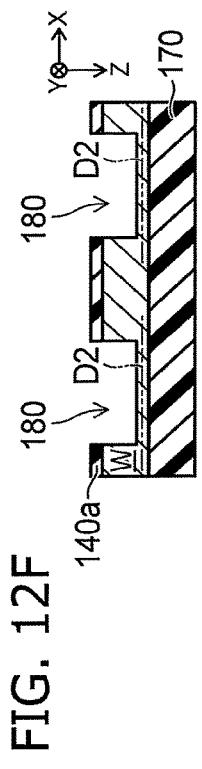
Figure 12C:
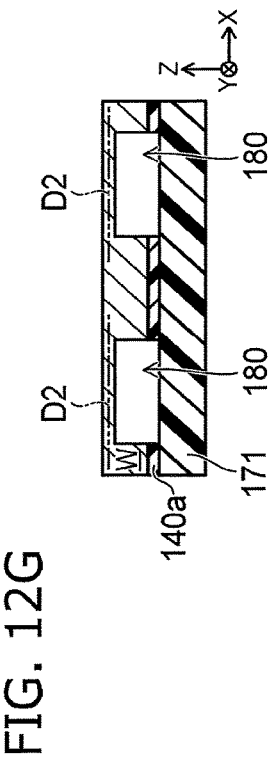
Figure 12D:
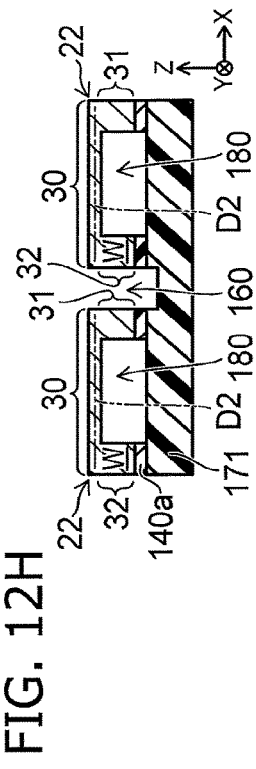

As shown in FIG. 11D and FIG. 12D, for example, the method of the fourth embodiment described with reference to FIG. 9A to FIG. 10D is used to polish the second surface of the wafer W, bond the second surface of the wafer W to the DAF 140a, and peel the surface protection tape 110 from the first surface of the wafer W.

Figure 11E:
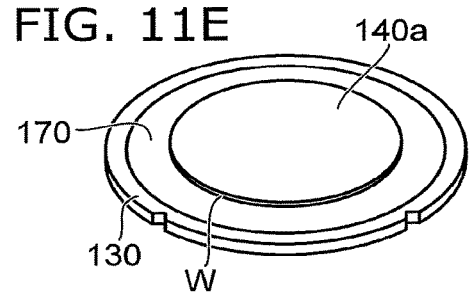
Figure 12E:
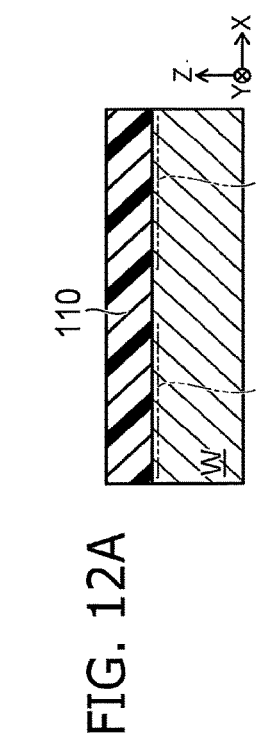

Then, as shown in FIG. 11E and FIG. 12E, the adhesive force of the bonding resin 140b is reduced by, for example, irradiating ultraviolet. Continuing, the wafer W is inverted; and the first surface of the wafer W is bonded to the first dicing tape 170 provided on the dicing ring 130. Continuing, for example, the bonding resin 140b and the base material 140c are peeled from the DAF 140a.

Figure 11F:
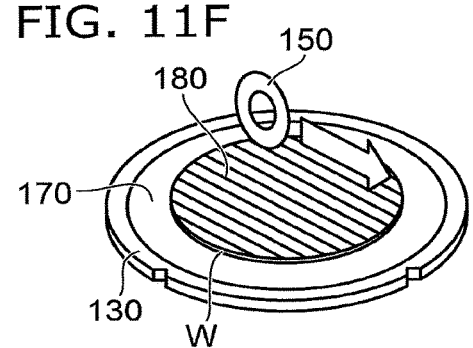
Figure 12F:
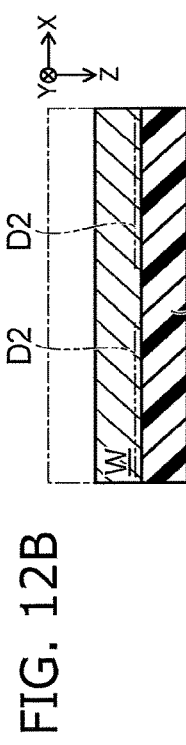

Continuing as shown in FIG. 11F and FIG. 12F, the trench 180 is formed in the wafer W by using the blade 150.

Figure 12G:
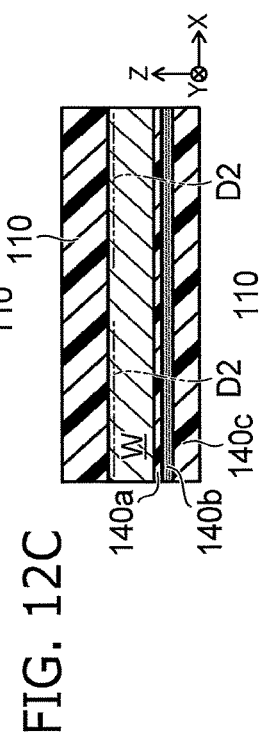

Then, as shown in FIG. 12G, the wafer W is inverted; and the DAF 140a is bonded to the second dicing tape 171.

Figure 11G:
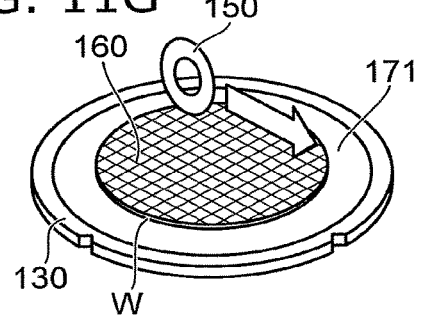
Figure 12H:
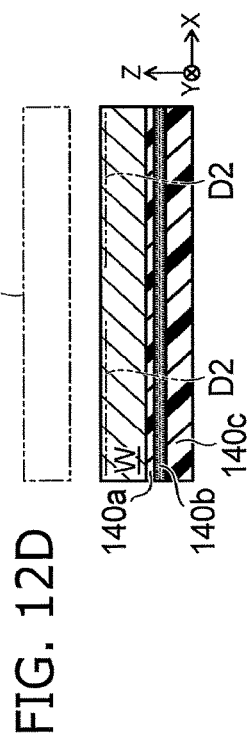

Continuing as shown in FIG. 11G and FIG. 12H, the wafer W is diced using the blade 150. The dicing line 160 is formed in the wafer W. Thereby, for example, the second semiconductor chips 22 are obtained on the second dicing tape 171. Subsequently, the second semiconductor chips 22 are picked up from the second dicing tape 171 and bonded on the base 1.

Thus, for example, it is also possible to form the trench 180 before the dicing line 160. According to the manufacturing method according to the fifth embodiment, the trench 180 is formed before dividing the wafer W into the second semiconductor chips 22; therefore, for example, an advantage can be obtained in that the positional shift is low when forming the trench 180.

Fifth Embodiment: First Modification

Figure 13A:
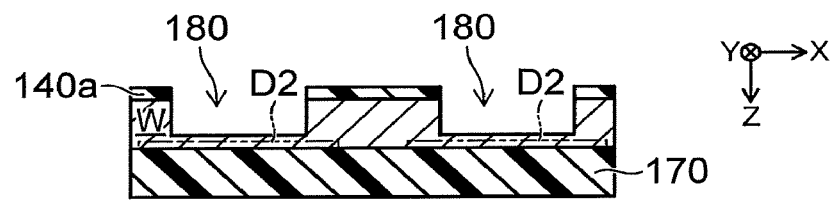
FIG. 13A to FIG. 13C are schematic cross-sectional views in order of the processes, illustrating a method for manufacturing a semiconductor device according to a first modification of the fifth embodiment.
Figure 13B:
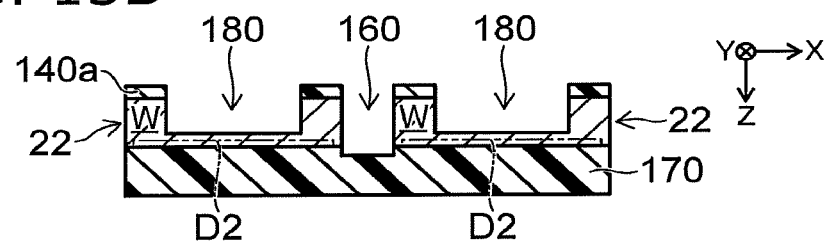
Figure 13C:
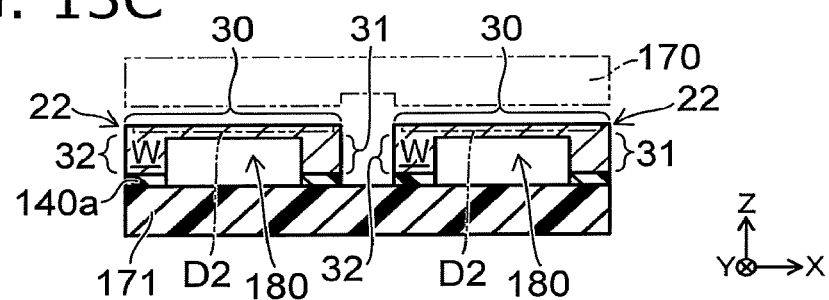

FIG. 13A to FIG. 13C are schematic cross-sectional views in order of the processes, illustrating a method for manufacturing a semiconductor device according to a first modification of the fifth embodiment.

As shown in FIG. 13A, for example, the method of the fifth embodiment described with reference to FIG. 11A to FIG. 12F is used to form the trench 180 in the wafer W on the first dicing tape 170 by using a blade.

Then, as shown in FIG. 13B, the dicing line 160 is formed in the wafer W on the first dicing tape 170 by using a blade. Thereby, for example, the second semiconductor chips 22 are obtained on the first dicing tape 170.

Continuing as shown in FIG. 13C, the wafer W is inverted; and a bonding portion 140b is bonded to the second dicing tape 171. Continuing, the first dicing tape 170 is peeled from the element formation surface. Subsequently, the second semiconductor chips 22 are picked up from the second dicing tape 171 and bonded on the base 1.

Thus, it is also possible to form the dicing line 160 without inverting the wafer W. p In the case where the trench 180 is formed using a blade, it is also possible to form the trench 180 in the same process as the dicing line 160. In other words, the formation process of the trench 180 shown in FIG. 13A and the dicing process shown in FIG. 13B are performed simultaneously. By changing the depth of the blade passing through the wafer W, the trench 180 and the dicing line 160 can be made individually. For example, when forming the trench 180, the blade 150 passes shallowly through the wafer W not to divide the wafer W; and when forming the dicing line 160, the blade 150 passes deeply through the wafer W to divide the wafer W. Thereby, the trench 180 and the dicing line 160 can be formed in the same process.

The trench 181 also can be formed in the dicing process. Also, it is possible to form the recess 182 with the dicing line 160 in the dicing process by, for example, modifying a tool such as the blade, etc.

Thus, the processes of forming the trench 181 or 182 or the recess 182 in each of the multiple semiconductor chips can be performed in at least one of the following (a) to (c):

(a) Before the process of dividing the wafer W into the multiple semiconductor chips;

(b) After the process of dividing the wafer W into the multiple semiconductor chips; or (c) In the process of dividing the wafer W into the multiple semiconductor chips.

Sixth Embodiment

FIG. 14A to FIG. 14G are schematic perspective views in order of the processes, illustrating a method for manufacturing a semiconductor device according to a sixth embodiment. FIG. 15A to FIG. 15H are schematic cross-sectional views in order of the processes, illustrating the method for manufacturing the semiconductor device according to the sixth embodiment. For example, a method for manufacturing the second semiconductor chip 22 is illustrated in the sixth embodiment.

Figure 14A:
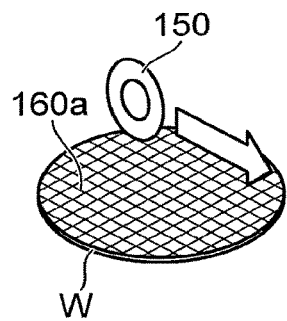
FIG. 14A to FIG. 14G are schematic perspective views in order of the processes, illustrating a method for manufacturing a semiconductor device according to a sixth embodiment.

As shown in FIG. 14A and FIG. 15A, by using the blade 150, a half-cut trench 160a is formed in the first surface of the silicon wafer W in which the multiple second semiconductor element portions D2 are formed. The half-cut trench 160a is formed along each of the X-axis direction and the Y-axis direction. For example, the depth in the Z-axis direction of the half-cut trench 160a is set to a depth that is not less than the thickness (the final thickness, i.e., the finished thickness) in the Z-axis direction of the second semiconductor chip 22.

Figure 14B:
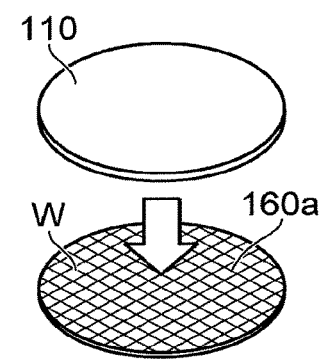

Then, as shown in FIG. 14B and FIG. 15B, the surface protection tape 110 is bonded on the first surface of the wafer W in which the half-cut trench 160a is formed.

Figure 14C:
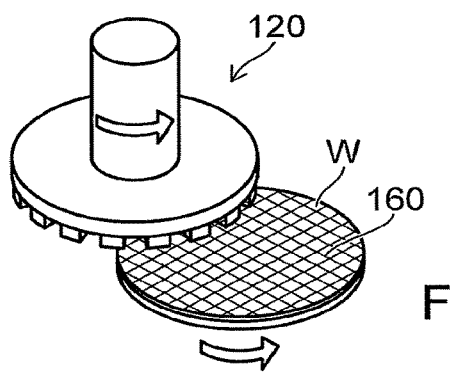

Continuing as shown in FIG. 14C and FIG. 15C, the wafer W is inverted; and the second surface of the wafer W is caused to recede by polishing using the grinding wheel 120. The wafer W is divided into the multiple second semiconductor chips 22. In other words, the sixth embodiment is an example using so-called DBG (Dicing Before Grinding) in which the dicing process is performed before the BSG process.

Figure 14D:
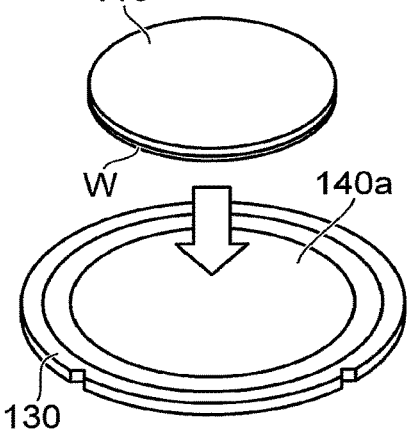

Then, as shown in FIG. 14D and FIG. 15D, the wafer W is inverted; and the second surface of the wafer W is bonded to a bonding resin, e.g., the DAF 140a bonded on the dicing ring 130.

Figure 14E:
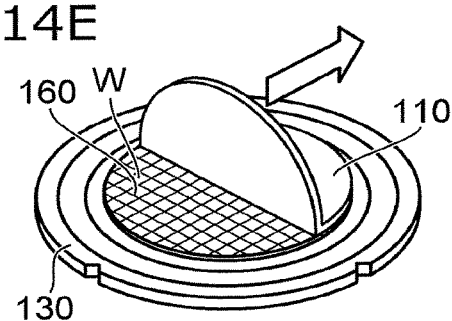

Continuing as shown in FIG. 14E and FIG. 15E, the surface protection tape 110 is peeled from the first surface of the wafer W.

Figure 14F:
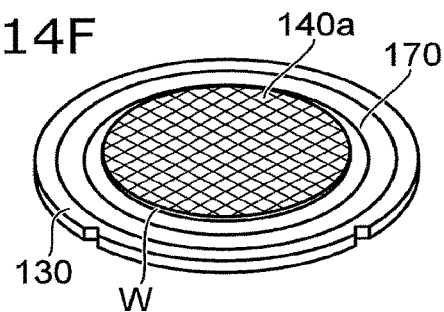

Then, as shown in FIG. 14F and FIG. 15F, the adhesive force of the bonding resin 140b is reduced; subsequently, the wafer W is inverted; and the first surface of the wafer W is bonded to the first dicing tape 170. Continuing, the bonding resin 140b and the base material 140c are peeled from the DAF 140a.

Figure 14G:
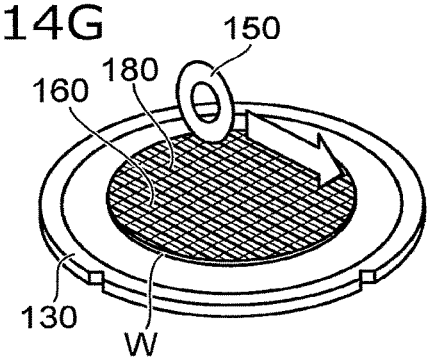

Continuing as shown in FIG. 14G and FIG. 15G, a recess is formed in the wafer W divided into the multiple second semiconductor chips 22. In the embodiment, the trench 180 is formed in the wafer W by using, for example, the blade 150. Continuing, the DAF 140a is divided for each of the multiple second semiconductor chips 22 by cutting the DAF 140a. For example, it is sufficient to use a laser 151 to cut the DAF 140a. The cutting of the DAF 140a by the laser 151 may be performed in the process shown in FIG. 15E.

Continuing as shown in FIG. 15H, the second semiconductor chips 22 are inverted; and the DAF 140a is bonded to the second dicing tape 171. Subsequently, the second semiconductor chips 22 are picked up from the second dicing tape 171 and bonded on the base 1.

As in the sixth embodiment, it is also possible to use DBG to perform the dicing of the wafer W.

Seventh Embodiment

Figure 16:
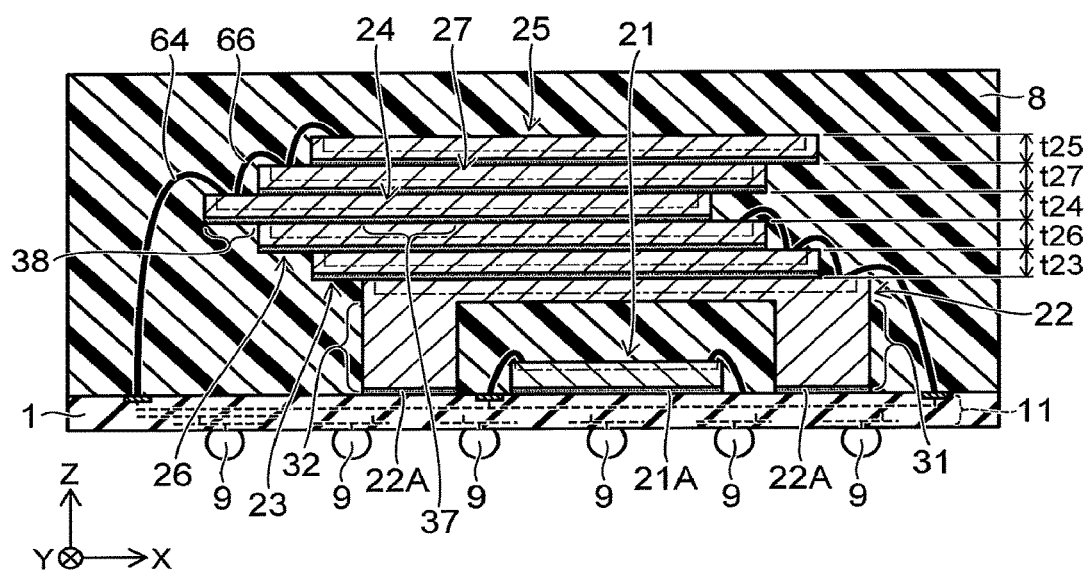
FIG. 16 is a schematic cross-sectional view illustrating a semiconductor device according to a seventh embodiment.

FIG. 16 is a schematic cross-sectional view illustrating a semiconductor device according to a seventh embodiment.

As shown in FIG. 16, the semiconductor device 100f according to the sixth embodiment is an example in which thicknesses t23 to t27 in the Z-axis direction of the third to seventh semiconductor chips 23 to 27 are equal to each other.

In the semiconductor device according to the embodiment, for example, the multiple semiconductor chips are stacked while being shifted in the X-axis direction, and are stacked further in the reverse orientation partway through in the stacking direction. For example, in the semiconductor device 100f according to the seventh embodiment, the stacking direction is changed to the reverse orientation at the fourth semiconductor chip 24. The fourth semiconductor chip 24 has a configuration like, for example, a "cantilever beam" with respect to the second, third, and fifth to seventh semiconductor chips 22, 23, and 25 to 27 stacked in the Z-axis direction. The fourth semiconductor chip 24 includes a seventh portion 37 that overlaps at least one of the first or second portion 31 or 32, and an eighth portion 38 that overhangs from the second semiconductor chip 22.

For example, in the case where an insulating resin material 300 such as that of the semiconductor device 100r according to the reference example described with reference to FIG. 4A is used, the insulating resin material 300 has a low elastic modulus; therefore, for example, micro flexing and/or "vibrations" accompanying the micro flexing occur easily due to impact of the wire bonding. In particular, for the fourth semiconductor chip 24 having a configuration like a "cantilever beam," a space widens between the base 1 and the eighth portion 38 of the fourth semiconductor chip 24 in the wire bonding. Moreover, the fourth pad electrode 24P (referring to FIG. 3A) is disposed in the eighth portion 38. Therefore, the "flexing" and/or the "vibrations" occur particularly easily at the fourth semiconductor chip 24 due to the impact of the wire bonding. Of the fourth semiconductor chip 24, the eighth portion 38 flexes and vibrates particularly easily.

There is a possibility that the "flexing" and/or the "vibrations" of the fourth semiconductor chip 24 may reduce the precision and/or the bonding strength of the wire bonding. For example, in the case where the fourth semiconductor chip 24 flexes or vibrates, the application of the bonding energy to the fourth interconnect member 64 and the fourth pad electrode 24P in the wire bonding easily becomes insufficient. Therefore, there are circumstances in which it is difficult to obtain a sufficient bonding strength between the fourth interconnect member 64 and the fourth pad electrode 24P. To suppress such a decrease of the precision of the wire bonding, the thickness of the semiconductor chip having the configuration like a "cantilever beam," e.g., the thickness t24 in the Z-axis direction of the fourth semiconductor chip 24 is set to be thicker than thicknesses in the Z-axis direction of the other semiconductor chips.

In the semiconductor device 100f according to the seventh embodiment, the semiconductor chip of the lowermost layer of the stack is the second semiconductor chip 22. For example, the rigidity of the second semiconductor chip 22 is high compared to that of the insulating resin material 300 (referring to FIGS. 3A and 3B). Moreover, for example, the seventh portion 37 of the fourth semiconductor chip 24 is positioned on the second portion 32 in the Z-axis direction. Therefore, for example, compared to the semiconductor device 100r according to the reference example (referring to FIGS. 3A and 3B), the flexing and/or the vibrations accompanying the flexing do not occur easily in the fourth semiconductor chip 24. Accordingly, it is also possible to set the thickness t24 to be thin. Of course, for example, the thickness t24 may be thicker than the thicknesses t23 and t25 to t27.

For example, in the seventh embodiment, the thickness t24 is set to be the same as, for example, the thicknesses t23 and t25 to t27 in the Z-axis direction of the third and fifth to seventh semiconductor chips 23 and 25 to 27. Although the thicknesses t23 to t27 are set to have the same thickness, it is unnecessary for the thicknesses to be strictly the same thickness. For example, errors within the range of tolerances are included in the thicknesses t23 to t27.

According to the seventh embodiment, for example, the thicknesses t23 to t27 in the Z-axis direction of the third to seventh semiconductor chips 23 to 27 can be equal to each other while suppressing the vibrations of the semiconductor chips that may occur in the wire bonding. Thereby, even more of a thickness reduction of the package can be realized.

Eighth Embodiment

Figure 17A:
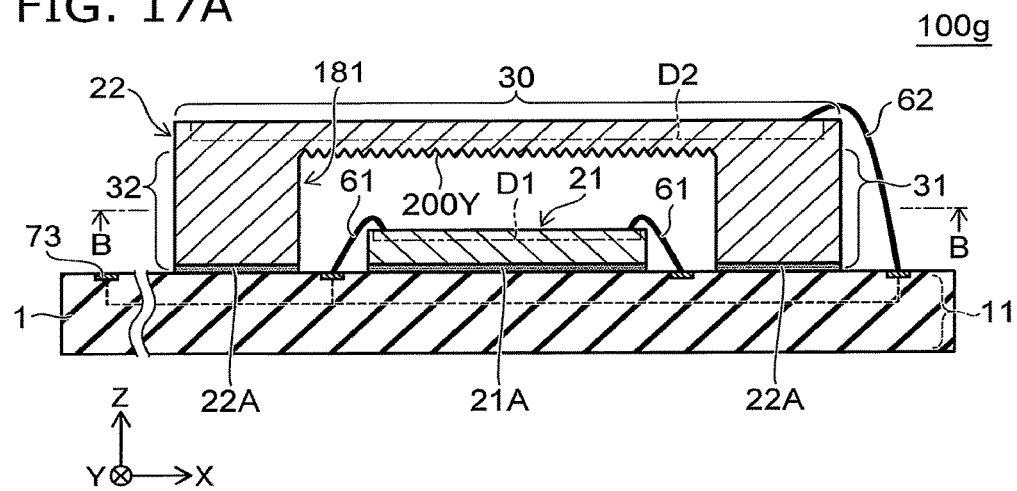
FIG. 17A is a schematic cross-sectional view illustrating a semiconductor device according to an eighth embodiment.
Figure 17B:
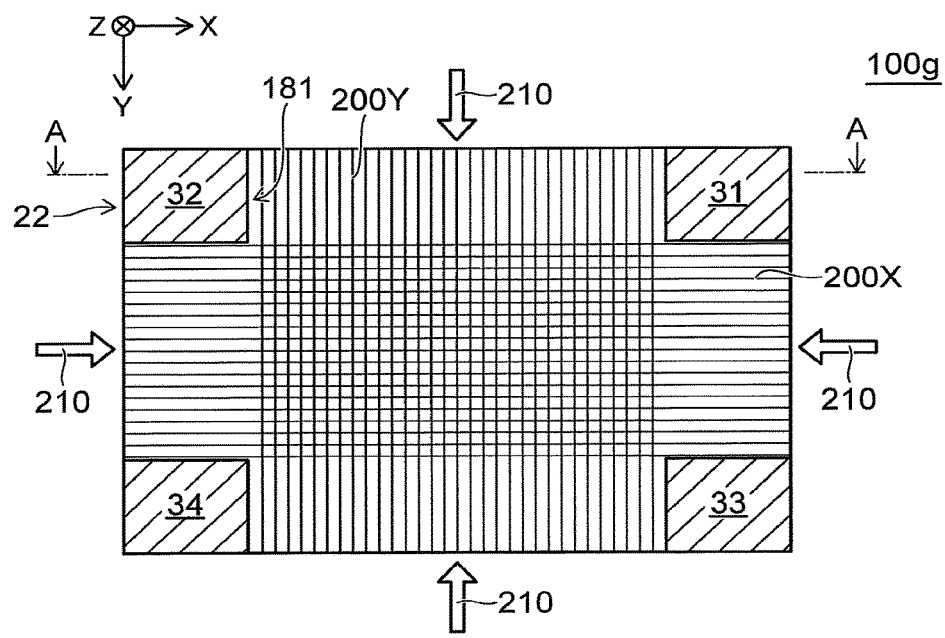
FIG. 17B is a schematic plan view illustrating the semiconductor device according to the eighth embodiment.

FIG. 17A is a schematic cross-sectional view illustrating a semiconductor device according to an eighth embodiment. FIG. 17B is a schematic plan view illustrating the semiconductor device according to the eighth embodiment. The base 1 and the first and second semiconductor chips 21 and 22 are shown in FIG. 17A. In FIG. 17B, the second semiconductor chip 22 is shown; and a portion of the second semiconductor chip 22 is shown as a cross section. The cross section shown in FIG. 17B is along line B-B in FIG. 17A. FIG. 17B is a drawing in which the second semiconductor chip 22 is viewed along the Z-axis direction from the base 1 side toward the first region 30; the first to fourth portions 31 to 34 each are shown as cross sections; and the back surface of the first region 30 is shown as a plane. The cross section shown in FIG. 17A is along line A-A in FIG. 17B.

As shown in FIG. 17A and FIG. 17B, the semiconductor device 100g according to the eighth embodiment is, for example, an example in which notches 200X and 200Y are provided in the trench 181 of the second semiconductor chip 22 of the second embodiment. In the second semiconductor chip 22 of the first embodiment, for example, the notches 200Y are provided in the trench 180. For example, the notches 200X and 200Y are provided in the bottom surface of the first region 30. The bottom surface is the surface positioned opposite to the surface where the second semiconductor element portion D2 is formed. The notches 200X extend in the X-axis direction. The notches 200Y extend in the Y-axis direction.

Although described in the fourth to sixth embodiments, the trench 180 is formed by the blade 150 passing through the wafer W several times along the Y-axis direction. Also, the trench 181 is formed by the blade 150 further passing through the wafer W multiple times along the X-axis direction.

Figure 18A:
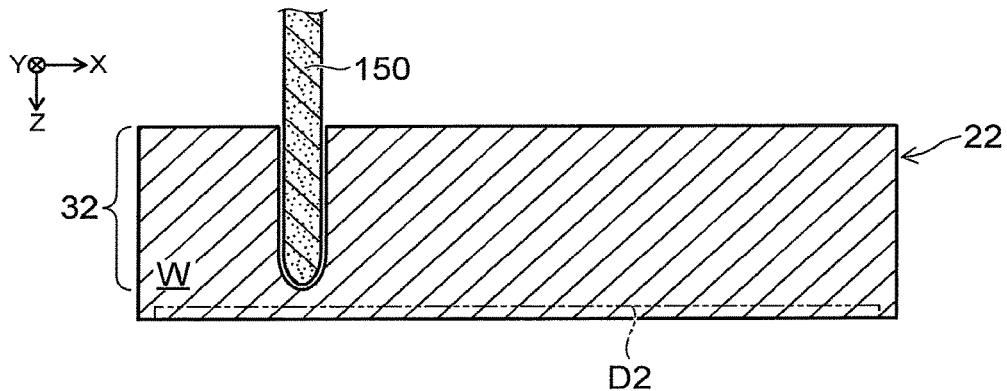
FIG. 18A to FIG. 18C are schematic cross-sectional views in order of the processes, illustrating one of the manufacturing methods that manufacture the semiconductor device according to the eighth embodiment.
Figure 18B:
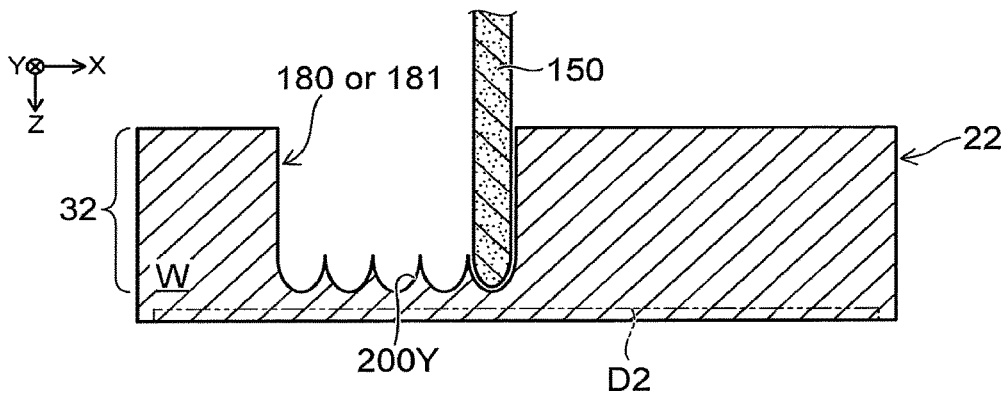
Figure 18C:
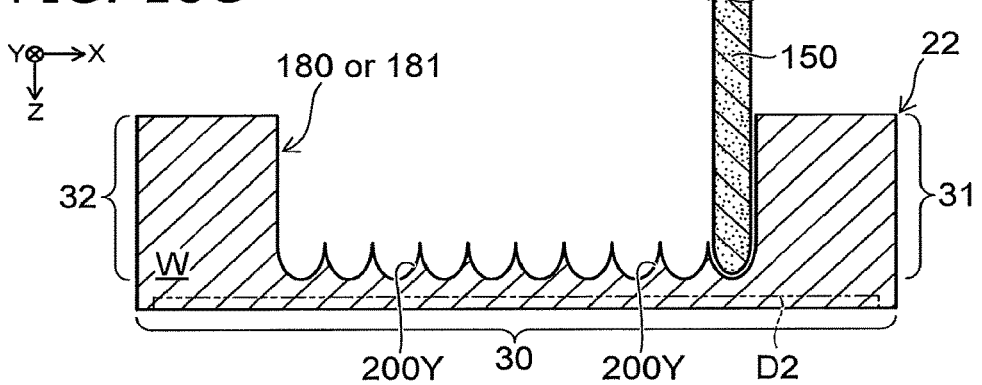

FIG. 18A to FIG. 18C are schematic cross-sectional views in order of the processes, illustrating one of the manufacturing methods that manufacture the semiconductor device according to the eighth embodiment.

As shown in order in FIG. 18A to FIG. 18C, for example, the trench 180 or 181 is formed by causing the blade 150, of which the blade tip has an elliptical configuration or a tapered configuration, to pass through the wafer W multiple times. In such a method for forming the trench 180 or 181, the notches 200X or 200Y are formed in the second semiconductor chip 22 or the wafer W each time the blade 150 passes through the wafer W.

Thus, the trench 180 or the trench 181 is formed by using the blade 150 of which the blade tip has an elliptical configuration or a tapered configuration, and by causing the blade 150 to pass through the wafer W multiple times. Thereby, the notches 200X or 200Y can be formed after forming the trench 180 or the trench 181 without adding a process.

The tip of the blade 150 easily becomes fine due to the wear when processing, etc. Therefore, the trench 180 and/or the trench 181 may have a tapered configuration that is finer toward the bottom portion.

According to the semiconductor device 100g according to the eighth embodiment, the notches 200X along the X-axis direction and the notches 200Y along the Y-axis direction are provided in the trench 181 of the second semiconductor chip 22. For example, the notches 200X and 200Y can function as "guides" that guide the insulating resin used to form the insulative sealing member 8 into the recess. Arrows 210 of FIG. 17B show the flow of the insulating resin.

According to the semiconductor device 100g, for example, an advantage can be obtained in that the insulative sealing member 8 is filled easily into the recess obtained between the first region 30 and the base 1 when the first to seventh semiconductor chips 21 to 27 are insulatively sealed with the insulative sealing member 8.

Further, compared to the case where the notches 200X or 200Y are not provided, the insulative sealing member 8 after curing is closely adhered more securely to the second semiconductor chip 22 inside the recess (an anchor effect). Accordingly, advantages also can be obtained in that the adhesion between the insulative sealing member 8 and the second semiconductor chip 22 improves; and the peeling of the insulative sealing member 8 can be suppressed.

Ninth Embodiment

FIG. 19A to FIG. 21B are schematic cross-sectional views in order of the processes, illustrating a method for manufacturing a semiconductor package according to a ninth embodiment.

Figure 19A:
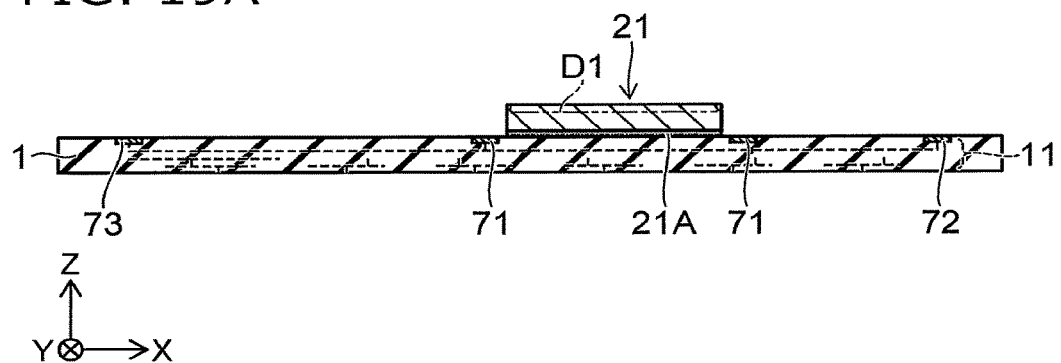
FIG. 19A and FIG. 19B are schematic cross-sectional views in order of the processes, illustrating a method for manufacturing a semiconductor package according to a ninth embodiment.

As shown in FIG. 19A, the first semiconductor chip 21 is bonded on the base 1. The base 1 includes the interconnect group 11 including multiple interconnects. The first semiconductor chip 21 includes the first semiconductor element portion D1, and the first pad electrodes 21P electrically connected to the first semiconductor element portion D1 (for the first pad electrodes 21P, refer to FIG. 2B).

Figure 19B:
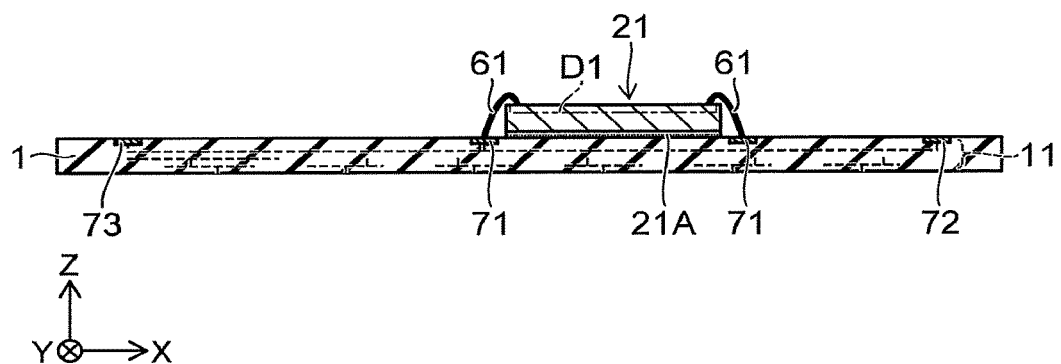

Then, as shown in FIG. 19B, the interconnects included in the interconnect group 11 and the first pad electrodes 21P are electrically connected. The interconnects are electrically connected to the first terminal electrodes 71. For example, the first terminal electrodes 71 and the first pad electrodes 21P are electrically connected by the first interconnect members 61. The connection method may be a wire bonding method using bonding wires such as those illustrated, or may be a flip chip method using bump electrodes.

Figure 20A:
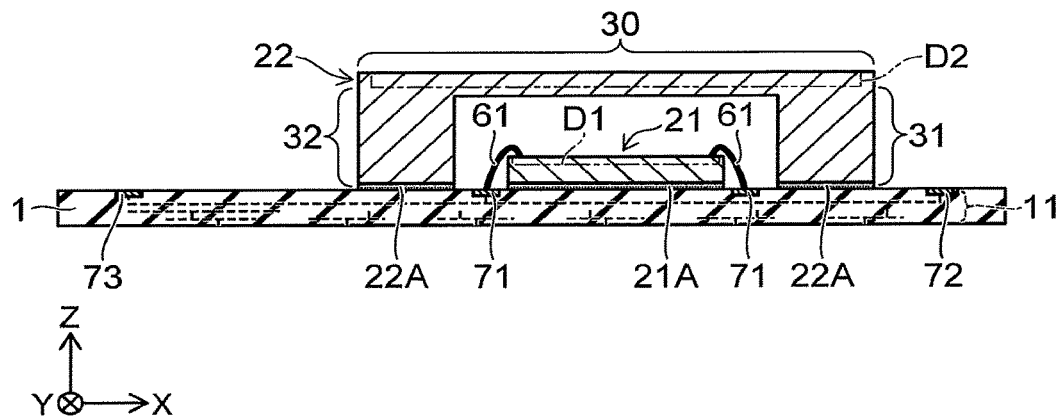
FIG. 20A and FIG. 20B are schematic cross-sectional views in order of the processes, illustrating the method for manufacturing the semiconductor package according to the ninth embodiment.

Continuing as shown in FIG. 20A, the second semiconductor chip 22 that includes the second pad electrodes 22P (referring to FIG. 3A and FIG. 3B) is bonded on the base 1. The second semiconductor chip 22 is bonded on the base 1 so that the first semiconductor chip 21 is surrounded with the base 1, the first region 30, the first portion 31, and the second portion 32.

Figure 20B:
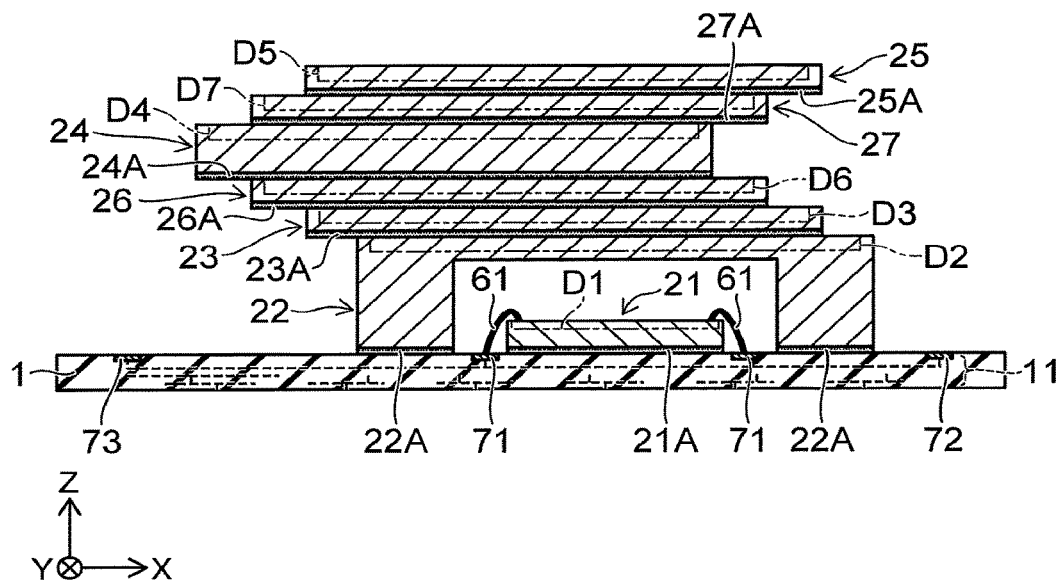

Then, as shown in FIG. 20B, multiple semiconductor chips that include pad electrodes, e.g., the third to seventh pad electrodes 23P to 27P (referring to FIG. 3A) and the third to seventh semiconductor chips 23 to 27 are bonded on the second semiconductor chip 22. When bonding, the bonding is performed so that the second to seventh pad electrodes 22P to 27P are exposed.

Figure 21A:
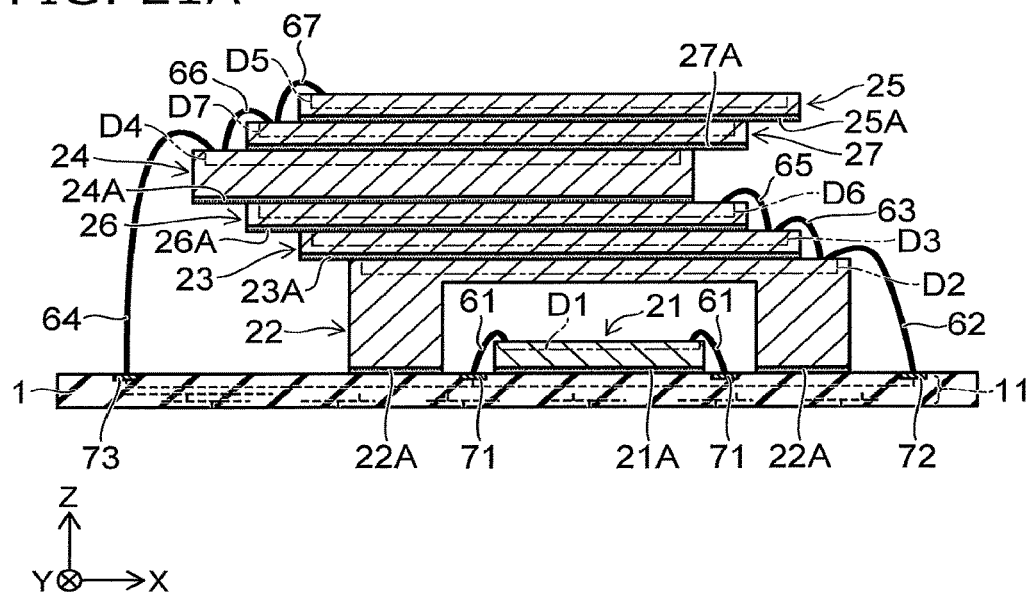
FIG. 21A and FIG. 21B are schematic cross-sectional views in order of the processes, illustrating the method for manufacturing the semiconductor package according to the ninth embodiment.

As shown in FIG. 21A, the interconnects included in the interconnect group 11 and the second to seventh pad electrodes 22P to 27P are electrically connected. The interconnects are electrically connected to the second and third terminal electrodes 72 and 73. For example, the second terminal electrodes 72, the third terminal electrodes 73, and the second to seventh pad electrodes 22P to 27P are electrically connected by the second to seventh interconnect members 62 to 67. This connection also is not limited to the wire bonding method that is illustrated and may be a flip chip method.

To prevent the interference between the semiconductor chips and the bonding tool of the bonding apparatus, for example, the process (the die mounting) shown in FIG. 20B and the process (the wire bonding) shown in FIG. 21A may be performed as follows:

(1) Die mounting of the second, third, and sixth semiconductor chips 22, 23, and 26;

(2) Wire bonding of the second, third, and fifth interconnect members 62, 63, and 65;

(3) Die mounting of the fourth, seventh, and fifth semiconductor chips 24, 27, and 25; and (4) Wire bonding of the fourth, sixth, and seventh interconnect members 64, 66, and 67.

By performing the die mounting and the wire bonding in the order of (1) to (4) recited above, the interference between the bonding tool and the semiconductor chips can be prevented.

Figure 21B:
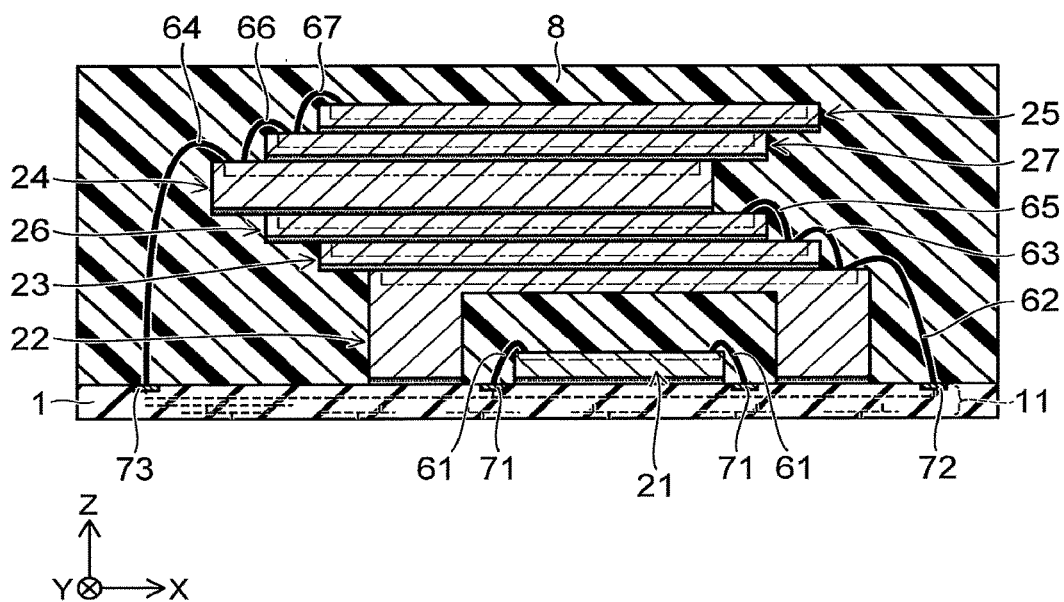

Then, as shown in FIG. 21B, at least the second to seventh semiconductor chips 22 to 27 on at least the base 1 are sealed with the insulative sealing member 8. In the example, an example is shown in which the first semiconductor chip 21 also is sealed with the insulative sealing member 8. After the sealing with the insulative sealing member 8, a design (not illustrated) such as a model number or the like is printed on the surface of the insulative sealing member 8.

Then, as shown in FIG. 1B, the external terminals 9 are formed at the base 1. The external terminals 9 are, for example, bump electrodes. By, for example, processes such as these, a semiconductor package is manufactured in which the semiconductor device according to the embodiment is sealed.

Thus, according to the embodiments, a semiconductor device, a method for manufacturing the semiconductor device, and a method for manufacturing a semiconductor package can be provided in which it is possible to reduce the thickness of the package.

The embodiments of the present invention have been described with reference to examples. However, the present invention is not limited to these examples. For example, with regard to the specific configuration of each element such as the base 1, the first semiconductor chip 21, the second semiconductor chip 22 and the like included in the semiconductor device of the embodiment, by appropriately selecting from among the known range by those skilled in the art, As long as they can be similarly carried out and obtain the same effect, they are included in the scope of the present invention. For example, in the embodiment, the second semiconductor chip 22 is a semiconductor memory chip and the first semiconductor chip 21 is a controller chip, but the present invention is not limited thereto.

Combinations of two or more elements of each example in a technically feasible range are also included in the scope of the present invention as long as the gist of the present invention is included.

In addition, all semiconductor devices that can be implemented by appropriately designing and modifying designs by those skilled in the art based on the above-described semiconductor device as an embodiment of the present invention also fall within the scope of the present invention as long as the gist of the present invention is included.

Besides, within the scope of the spirit of the present invention, those skilled in the art can conceive various modifications and modifications, and those modifications and modifications falling within the scope of the present invention is understood.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a base including interconnects;
a first semiconductor chip including a first semiconductor element portion; and
a second semiconductor chip,
wherein the first semiconductor chip is electrically connected to the second semiconductor chip via at least one of the interconnects,
the second semiconductor chip includes a first region, a first portion, and a second portion,
the first region includes a second semiconductor element portion,
the first portion is continuous with the first region,
the second portion is continuous with the first region and is separated from the first portion in a second direction crossing a first direction,
the first direction is from the base toward the first region,
the second semiconductor chip includes a trench surrounded with the first region, the first portion, and the second portion,
the trench penetrates through the second semiconductor chip in a third direction, the third direction crosses each of the first direction and the second direction, and
the first portion, the second portion, and at least a portion of the first semiconductor chip are positioned between the base and the first region.

2. The device according to claim 1, wherein
the first region includes a plane,
the plane spreads in the second direction and the third direction, and
at least the portion of the first semiconductor chip is positioned between the first portion and the second portion in the second direction.

3. A semiconductor device, comprising:
a base including interconnects;
a first semiconductor chip including a first semiconductor element portion; and
a second semiconductor chip,
wherein the first semiconductor chip is electrically connected to the second semiconductor chip via at least one of the interconnects,
the second semiconductor chip includes a first region, a first portion, and a second portion,
the first region includes a second semiconductor element portion,
the first portion is continuous with the first region,
the second portion is continuous with the first region and is separated from the first portion in a second direction crossing a first direction,
the first direction is from the base toward the first region,
the first portion, the second portion, and at least a portion of the first semiconductor chip are positioned between the base and the first region,
the first region includes a plane,
the plane spreads in the second direction and a third direction, the third direction crossing each of the first direction and the second direction,
the second semiconductor chip further includes:
a third portion continuous with the first region, the third portion being separated from the first portion and the second portion in the third direction; and
a fourth portion continuous with the first region, the fourth portion being separated from the third portion in the second direction and separated from the first portion and the second portion in the third direction, and
the third portion and the fourth portion each are positioned between the base and the first region.

4. A semiconductor device comprising:
a base including interconnects;
a first semiconductor chip including a first semiconductor element portion; and
a second semiconductor chip,
wherein the first semiconductor chip is electrically connected to the second semiconductor chip via at least one of the interconnects,
the second semiconductor chip includes a first region, a first portion, and a second portion,
the first region includes a second semiconductor element portion,
the first portion is continuous with the first region,
the second portion is continuous with the first region and is separated from the first portion in a second direction crossing a first direction,
the first direction is from the base toward the first region,
the first portion, the second portion, and at least a portion of the first semiconductor chip are positioned between the base and the first region,
the first region includes a plane,
the plane spreads in the second direction and a third direction, the third direction crossing each of the first direction and the second direction,
the second semiconductor chip further includes:
a fifth portion continuous with the first region, the first portion, and the second portion; and
a sixth portion continuous with the first region, the first portion, and the second portion, the sixth portion being separated from the fifth portion in the third direction, and
the fifth portion and the sixth portion each are positioned between the base and the first region.

5. The device according to claim 1, wherein
the second semiconductor chip further includes a pad electrode electrically connected to the second semiconductor element portion, and
the pad electrode is positioned on the first portion in the first direction.

6. The device according to claim 1, further comprising an insulative sealing member surrounding the second semiconductor chip and being provided on the base,
the insulative sealing member being further provided at least between the first portion and the second portion,
the insulative sealing member further surrounding the first semiconductor chip.

7. The device according to claim 1, further comprising a third semiconductor chip electrically connected to the first semiconductor chip,
the first region being positioned between the first semiconductor chip and the third semiconductor chip.

8. The device according to claim 1, further comprising a plurality of semiconductor chips stacked in the first direction on the second semiconductor chip,
at least one of the plurality of semiconductor chips including a seventh portion, an eighth portion, a semiconductor element portion, and a pad electrode, the seventh portion overlapping at least one of the first portion and the second portion in the first direction, the eighth portion overhanging from the second semiconductor chip, the pad electrode being electrically connected to the semiconductor element portion,
the pad electrode being disposed at the eighth portion.

9. The device according to claim 3, wherein
the second semiconductor chip further includes a pad electrode electrically connected to the second semiconductor element portion, and
the pad electrode is positioned on the first portion in the first direction.

10. The device according to claim 3, further comprising an insulative sealing member surrounding the second semiconductor chip and being provided on the base,
the insulative sealing member being further provided at least between the first portion and the second portion,
the insulative sealing member further surrounding the first semiconductor chip.

11. The device according to claim 1, further comprising a third semiconductor chip electrically connected to the first semiconductor chip,
the first region being positioned between the first semiconductor chip and the third semiconductor chip.

12. The device according to claim 1, further comprising a plurality of semiconductor chips stacked in the first direction on the second semiconductor chip,
at leak one of the plurality of semiconductor chips including a seventh portion, an eighth portion, a semiconductor element portion, and a pad electrode, the seventh portion overlapping at least one of the first portion and the second portion in the first direction, the eighth portion overhanging from the second semiconductor chip, the pad electrode being electrically connected to the semiconductor element portion, the pad electrode being disposed at the eighth portion.

13. The device according to claim 4, wherein
the second semiconductor chip further includes a pad electrode electrically connected to the second semiconductor element portion, and
the pad electrode is positioned on the first portion in the first direction.

14. The device according to claim 4, further comprising an insulative sealing member surrounding the second semiconductor chip and being provided on the base,
the insulative sealing member being further provided at least between the first portion and the second portion,
the insulative sealing member further surrounding the first semiconductor chip.

15. The device according to claim 4, further comprising a third semiconductor chip electrically connected to the first semiconductor chip,
the first region being positioned between the first semiconductor chip and the third semiconductor chip.

16. The device according to claim 4, further comprising a plurality of semiconductor chips stacked in the first direction on the second semiconductor chip,
at leak one of the plurality of semiconductor chips including a seventh portion, an eighth portion, a semiconductor element portion, and a pad electrode, the seventh portion overlapping at least one of the first portion and the second portion in the first direction, the eighth portion overhanging from the second semiconductor chip, the pad electrode being electrically connected to the semiconductor element portion,
the pad electrode being disposed at the eighth portion.

* * * * *